United States Patent
Emori et al.

(10) Patent No.: US 11,839,049 B2
(45) Date of Patent: Dec. 5, 2023

(54) COOLING APPARATUS

(71) Applicants: NISSAN MOTOR CO., LTD., Yokohama (JP); RENAULT S.A.S., Boulogne-Billancourt (FR)

(72) Inventors: Kenta Emori, Kanagawa (JP); Jumpei Niida, Kanagawa (JP); Shigeharu Yamagami, Kanagawa (JP)

(73) Assignees: NISSAN MOTOR CO., LTD., Yokohama (JP); RENAULT S.A.S., Boulogne-Billancourt (FR)

( * ) Notice: Subject to any disclaimer, the term of this patent is extended or adjusted under 35 U.S.C. 154(b) by 312 days.

(21) Appl. No.: 17/282,450

(22) PCT Filed: Oct. 5, 2018

(86) PCT No.: PCT/IB2018/001216
§ 371 (c)(1),
(2) Date: Apr. 2, 2021

(87) PCT Pub. No.: WO2020/070533
PCT Pub. Date: Apr. 9, 2020

(65) Prior Publication Data
US 2021/0384105 A1    Dec. 9, 2021

(51) Int. Cl.
*H05K 7/20* (2006.01)
*F28F 13/12* (2006.01)
*H01L 23/467* (2006.01)

(52) U.S. Cl.
CPC .......... *H05K 7/20136* (2013.01); *F28F 13/12* (2013.01); *F28F 2250/08* (2013.01); *H01L 23/467* (2013.01)

(58) Field of Classification Search
CPC ... H05K 7/20136; H01L 23/467; F28F 13/12; F28F 2250/08
See application file for complete search history.

(56) References Cited

U.S. PATENT DOCUMENTS

| | | | |
|---|---|---|---|
| 2008/0302510 A1* | 12/2008 | Ouyang | H01L 23/467 165/80.3 |
| 2010/0230087 A1 | 9/2010 | Ouyang | |
| 2011/0108249 A1 | 5/2011 | Iwamatsu | |

FOREIGN PATENT DOCUMENTS

| | | |
|---|---|---|
| JP | 2006-302918 A | 11/2006 |
| JP | 2011-100945 A | 5/2011 |
| JP | 2013-016569 A | 1/2013 |
| JP | 2013-077750 A | 4/2013 |
| JP | 2014-116398 A | 6/2014 |
| JP | 2016-76350 A | 5/2016 |
| JP | 2016-171238 A | 9/2016 |
| JP | 2018-022868 A | 2/2018 |

* cited by examiner

*Primary Examiner* — Mukundbhai G Patel
(74) *Attorney, Agent, or Firm* — Foley & Lardner LLP

(57) ABSTRACT

A cooling apparatus including a heat sink to which a heat generating body is joined, a main flow generation device configured to generate a main flow for cooling the heat sink, and an induced flow generation device configured to electrically generate an induced flow. The induced flow generation device is provided to a support member facing the heat sink.

19 Claims, 28 Drawing Sheets

US 11,839,049 B2

COOLING APPARATUS

TECHNICAL FIELD

The present invention relates to a cooling apparatus.

BACKGROUND ART

A power conversion device such as a converter includes electronic components, which are heat generating elements such as a semiconductor, a capacitor, and a coil, and therefore, a heat sink for cooling them is attached to the power conversion device. On the other hand, in such a power conversion device, it is required that the respective circuit elements and the cooling structure be configured in high density in terms of achieving an increase in electric power and a reduction in size.

However, since the heat generation density in the power conversion device is increased due to the densification, higher cooling performance is required. Herein, the cooling performance of the heat sink generally depends on its volume (heat capacity), its material (thermal conductivity), and its surface area (heat transfer area) according to its shape.

Therefore, in order to improve the cooling performance, an increase in the size of the heat sink itself is required, which leads to an increase in the size of the entire power conversion device. Therefore, in terms of achieving the improvement of the cooling performance while suppressing the increase in the size of the heat sink itself, the improvement in the material and shape of the heat sink has been studied.

In JP2013-016569A, a cooling apparatus using such a heat sink is proposed. In this cooling apparatus, a coolant is injected to a heat sink attached with a heat generating body through a plurality of ducts forming flow paths of the coolant.

SUMMARY OF INVENTION

However, in the conventional cooling apparatus described above, since the plurality of ducts is provided for cooling the heat sink by the turbulence of the coolant, the structure of the entire cooling apparatus is increased in size and complicated.

In view of such circumstances, it is an object of the present invention to provide a cooling apparatus that makes it possible to properly adjust a path of a coolant flow while suppressing an increase in size.

According to an aspect of the invention, a cooling apparatus is provided, including a heat sink to which a heat generating body is joined, a main flow generation device configured to generate a main flow for cooling the heat sink, and an induced flow generation device configured to electrically generate an induced flow. The induced flow generation device is provided to a support member facing the heat sink.

DESCRIPTION OF EMBODIMENTS

Embodiments of the present invention will be described below with reference to the drawings and so on. The drawings used in describing the embodiments and their modifications schematically illustrate the main parts of the configurations of the embodiments.

First Embodiment

A first embodiment will be described below.

Figure 1:
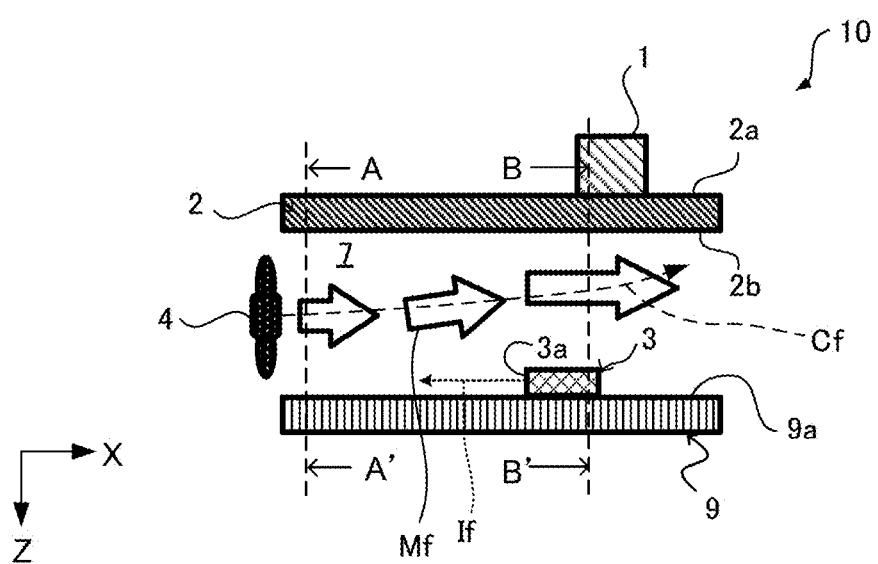
FIG. 1 is a sectional view for explaining the configuration of a cooling apparatus according to a first embodiment of the present invention.
Figure 2:
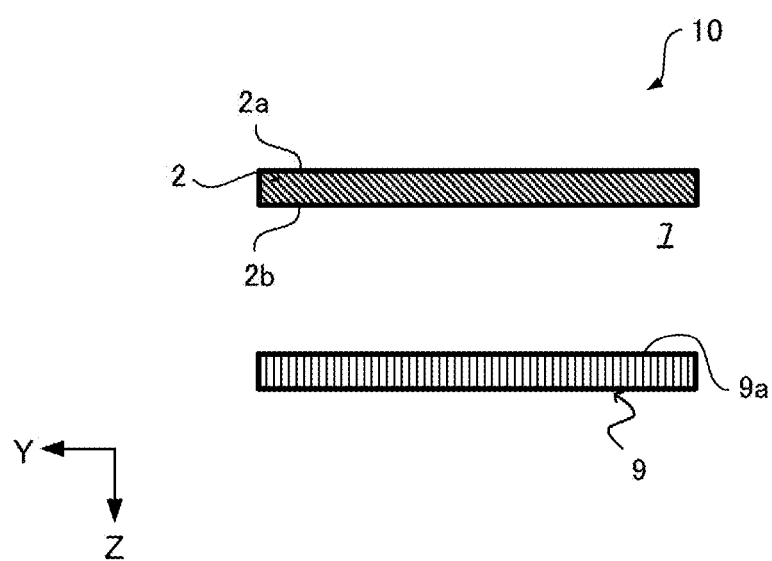
FIG. 2 is a sectional view taken along the line A-A' in FIG. 1.
Figure 3:
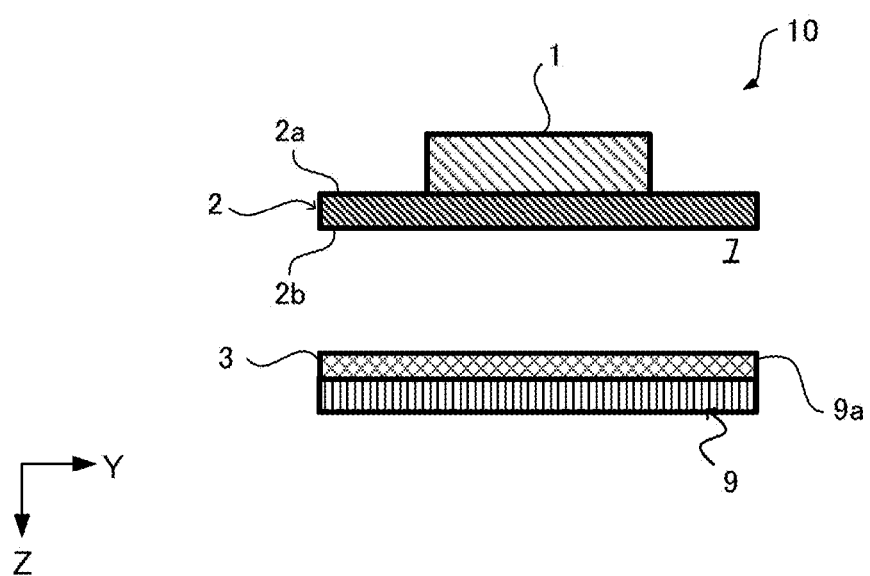
FIG. 3 is a sectional view taken along the line B-B' in FIG. 1.

FIG. 1 is a sectional view in the flow direction for explaining the configuration of a cooling apparatus 10 according to this embodiment. FIG. 2 is a sectional view taken along the line A-A' in FIG. 1. FIG. 3 is a sectional view taken along the line B-B' in FIG. 1.

As illustrated, the cooling apparatus 10 includes a heat generating body 1, a heat sink body 2 forming a heat sink of this embodiment, an induced flow generation device 3 that generates an induced flow If, a fan 4 as a main flow generation device that generates a main flow Mf, and a support member 9 disposed to face the heat sink body 2. The heat generating body 1 is one of various heat generating elements included in motors, engines, and electronic devices such as home electrical appliances. In particular, an electronic component such as a semiconductor, a semiconductor mold package, a capacitor, or a coil is assumed as the heat generating body 1.

The heat sink body 2 is a structure that dissipates the heat generated by the heat generating body 1 into the ambient atmosphere. In this embodiment, the heat sink body 2 is formed as a plate-like member. The heat generating body 1 is joined to a first surface 2a being the surface of the heat sink body 2 on one side (the Z-axis negative direction side) thereof.

The heat sink body 2 is made of, for example, a metallic material with a relatively high thermal conductivity, such as copper or aluminum, or a non-metallic material with a relatively high thermal conductivity, such as FR4 (Flame Retardant Type 4) or ceramic.

The induced flow generation device 3 is provided on a surface 9a of the support member 9 facing a second surface 2b being the back surface of the first surface 2a of the heat sink body 2. In particular, the induced flow generation device 3 is provided to extend over the entirety of an extending region, in the Y-axis direction, of the surface 9a of the support member 9. The induced flow generation device 3 has an induced flow generation part 3a on one side in the X-axis direction (the X-axis negative direction in the figure). Therefore, the induced flow generation device 3 can generate the induced flow If in the X-axis negative direction in FIG. 2.

The relationship in width between the heat generating body 1 and the surface 9a of the support member 9 in the Y-axis direction can be adjusted as appropriate so that the induced flow If has an effective width for heat transfer according to the width and the amount of heat of the heat generating body 1 and the area in which the heat spreads to the heat sink body 2.

More specifically, the induced flow generation device 3 is a device that electrically acts on molecules in an ambient phase (a gas phase such as an inert gas atmosphere such as an air atmosphere, a nitrogen atmosphere, or an argon atmosphere, or a liquid phase such as water) to bias the charge distribution in the atmosphere, thereby providing the pressure difference to generate the induced flow If. Hereinafter, for convenience of description, it is assumed that the ambient phase is an air atmosphere (an air layer 7). However, the following description can be applied in the same way to another gas phase or a liquid phase.

The induced flow generation device 3 of this embodiment is disposed upstream in the flow direction of the main flow Mf (the X-axis direction) with respect to the heat generating body 1.

The fan 4 is configured as a DC/AC axial fan, a blower fan, or the like as appropriate in consideration of factors such as the air flow volume and the air flow velocity that are required according to the shape and the installation space of a component or a device assumed as the heat generating body 1. When the heat sink body 2 is provided with heat dissipation fins 6, it is preferable to configure the fan 4 of a type according to the shape of the heat dissipation fins 6.

In this embodiment, the fan 4 is provided in the vicinity of one end portion in the X-axis direction (an end portion on the left side in FIG. 1) of the heat sink body 2.

With this configuration, when the fan 4 is driven, the main flow Mf flows in the X-axis positive direction between the second surface 2b of the heat sink body 2 and the surface 9a of the support member 9. On the other hand, as described above, the induced flow If flows in the X-axis negative direction from the induced flow generation device 3. Therefore, according to the configuration of this embodiment, the flow direction of the main flow Mf and the flow direction of the induced flow If are generally parallel to each other and generally opposite to each other.

Consequently, the main flow Mf from the fan 4 is impeded by the induced flow If in the opposite direction from the induced flow generation device 3 so as to be guided in the direction of the second surface 2b of the heat sink body 2 (the Z-axis negative direction). In particular, in this embodiment, since the induced flow generation device 3 is disposed upstream in the flow direction of the main flow Mf with respect to the heat generating body 1, the main flow Mf is guided in the direction of the second surface 2b by the induced flow If upstream of the heat generating body 1. In particular, the center position Cf of the flow of the main flow Mf where the flow velocity becomes relatively high is guided to approach the heat generating body 1. Consequently, it is possible to facilitate the heat transfer from the second surface 2b of the heat sink body 2 to the air layer 7.

In the cooling apparatus 10 having the configuration described above, the heat of the heat generating body 1 is first transferred to the heat sink body 2. Then, the heat transferred to the heat sink body 2 is conducted in the Z-axis negative direction (the direction of the induced flow generation device 3) while spreading in the heat sink body 2.

On the other hand, the induced flow If generated by the induced flow generation device 3 flows in the X-axis positive direction along the second surface 2b of the heat sink body 2 and facilitates the heat transfer between the second surface 2b of the heat sink body 2 and the air layer 7. In particular, since it is possible to allow the induced flow If to flow to the interface between the heat sink body 2 and the air layer 7 in contact with the heat sink body 2 just under the heat generating body 1, it is possible to suppress the excessive growth of a boundary layer like a heat insulating layer generated between solid and fluid. As a result, it is possible to effectively perform the cooling at a relatively low flow rate of the induced flow If.

According to this embodiment having the configuration described above, the following operations and effects are exhibited.

The cooling apparatus 10 according to this embodiment includes the heat sink body 2 as the heat sink to which the heat generating body 1 is joined, the fan 4 as the main flow generation device that generates the main flow Mf for cooling the heat sink body 2, and the induced flow generation device 3 that electrically generates the induced flow If. The induced flow generation device 3 is provided on the support member 9 facing the heat sink body 2.

Consequently, the flow direction of the main flow Mf of the fan 4 for cooling the heat transferred from the heat generating body 1 to the heat sink body 2 can be adjusted by the induced flow If generated by the induced flow generation device 3. Therefore, it is possible to guide the main flow Mf to a portion of the heat sink body 2 in the vicinity of the heat generating body 1 or the like, where the amount of heat becomes relatively large, so as to facilitate the heat transfer in this portion, and further, it is possible to reduce the flow velocity of the main flow Mf to suppress the pressure loss at a portion (a portion distant from the heat generating body 1) of the heat sink body 2 where the amount of heat is relatively small. As a result, it is possible to further improve the cooling efficiency of the heat generating body 1.

In this embodiment, the induced flow generation device 3 is disposed so as to generate the induced flow If that guides the flow of the main flow Mf in the direction of the heat sink body 2 (the Z-axis negative direction in FIG. 1).

Consequently, since the flow of the main flow Mf from the fan 4 is gathered near the heat sink body 2, it is possible to increase the flow velocity near the heat sink body 2. Therefore, it is possible to further facilitate the heat transfer between the heat sink body 2 and the air layer 7 so that the cooling performance can be further improved.

In particular, in this embodiment, the induced flow generation device 3 and the fan 4 are disposed so that the flow direction of the main flow Mf and the flow direction of the induced flow If are generally parallel to each other and generally opposite to each other.

Consequently, it is possible to impede the flow of the main flow Mf near the induced flow generation portion (the induced flow generation part 3a) of the induced flow generation device 3. Therefore, it is possible to guide the flow of the main flow Mf in the direction of the heat sink body 2 facing the support member 9 on which the induced flow generation device 3 is provided. As a result, it is possible to improve the flow velocity of the cooling air near the heat sink body 2 to further improve the cooling performance.

In this embodiment, the induced flow generation device 3 is disposed at the upstream position (on the X-axis negative direction side in FIG. 1) of the heat generating body 1 in the flow direction of the main flow Mf.

Consequently, a portion (a portion at high flow rate and high flow velocity) of the main flow Mf guided and gathered in the direction of the heat sink body 2 by the action of the induced flow If can be applied to a portion of the heat sink body 2 relatively close to the heat generating body 1. As a result, it is possible to further facilitate the heat transfer between the heat sink body 2 and the air layer 7 so that it is possible to further improve the cooling performance for the heat generating body 1.

An electronic component provided in a motor, an engine, or an electronic device such as a home electrical appliance is assumed as the heat generating body 1 of this embodiment. That is, the configuration of the cooling apparatus 10 of this embodiment can be applied by employing as the heat generating body 1 an electronic component that generates heat by energization, such as a semiconductor, a capacitor, or a coil. Therefore, the configuration suitable for cooling the electronic component is provided.

Modifications 1-1 to 1-3 of the first embodiment will be described below.

(Modification 1-1)

Figure 4:
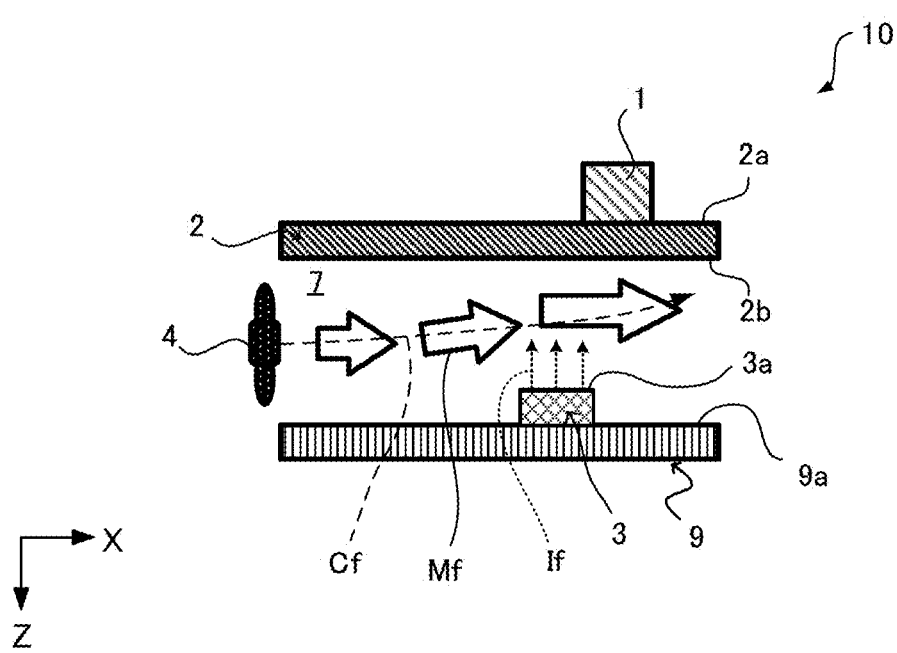
FIG. 4 is a sectional view for explaining the configuration of a cooling apparatus according to a modification 1-1.

FIG. 4 is a sectional view of a cooling apparatus 10 according to the modification 1-1. As illustrated, in the cooling apparatus 10 according to this modification 1-1, an induced flow generation device 3 is provided on a support member 9 in a state where an induced flow generation part 3a faces in the Z-axis negative direction so that an induced flow If flows toward a heat sink body 2.

With this configuration, the flow direction of a main flow Mf from a fan 4 is guided in the direction of the heat sink body 2 by the induced flow If.

According to the cooling apparatus 10 of this modification described above, the induced flow generation device 3 is disposed so that the induced flow If is generated in the direction to guide the flow of the main flow Mf to the heat sink body 2. The induced flow generation device 3 and the fan 4 are disposed so that the flow direction of the main flow Mf and the flow direction of the induced flow If are generally parallel to each other and generally opposite to each other. Further, the induced flow generation device 3 is disposed so that the flow of the induced flow If is generally perpendicular to the direction from the support member 9 toward the heat sink body 2.

With this configuration, it is possible to flow the induced flow If to hit against the main flow Mf from the fan 4 in the direction generally perpendicular to the flow direction of the main flow Mf. That is, in the way different from the configuration in which the flow direction of the main flow Mf and the flow direction of the induced flow If are generally parallel to each other and generally opposite to each other as illustrated in FIG. 1, it is possible to realize the configuration that generates the induced flow If in the direction to guide the flow of the main flow Mf to the heat sink body 2. As a result, even when the layout differs, such that the installation position of the fan 4 or the like differs, according to various uses of the cooling apparatus 10, the configuration that generates the induced flow If to guide the main flow Mf to the heat sink body 2 can be realized more universally according to the difference in layout.

A specific configuration that causes the flow direction of the induced flow If by the induced flow generation device 3 provided on the support member 9 to be the direction toward the heat sink body 2 is not limited to the configuration described in this modification. For example, two induced flow generation devices 3 that generate induced flows If generally parallel to the main flow Mf may be disposed on a surface 9a of the support member 9 so that their induced flow generation parts 3a face each other, and by colliding the induced flows If generated from the induced flow generation parts 3a against each other, a combined induced flow If heading in the vertical direction (the direction of the heat sink body 2) may be generated. That is, induced flows If by a plurality of induced flow generation devices 3 may be combined to generate a flow heading in the direction of the heat sink body 2.

(Modification 1-2)

Figure 5:
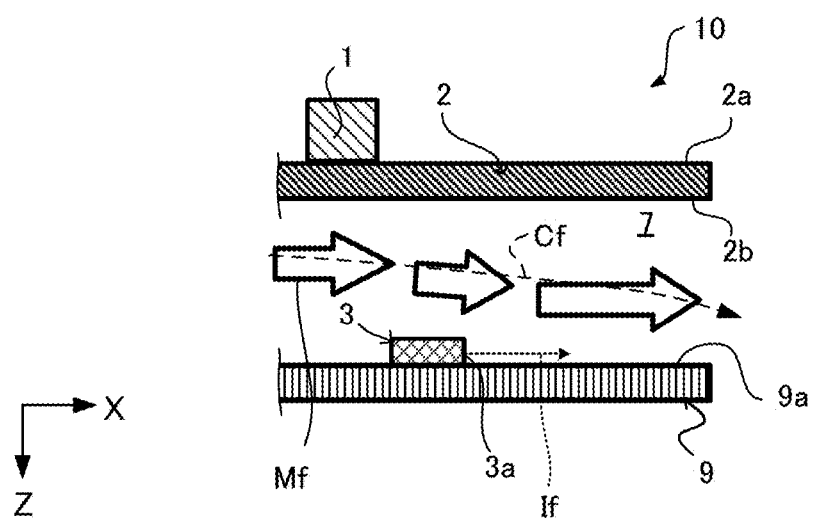
FIG. 5 is a sectional view for explaining the configuration of a cooling apparatus according to a modification 1-2.

FIG. 5 is a sectional view of a cooling apparatus 10 according to the modification 1-2. As illustrated, in the cooling apparatus 10 according to this modification 1-2, an induced flow generation device 3 is provided downstream in the flow direction of a main flow Mf (on the X-axis positive direction side in FIG. 5) with respect to a heat generating body 1.

In particular, the cooling apparatus 10 illustrated in FIG. 5 is assumed to be further disposed on the downstream side in the flow direction of the main flow Mf with respect to the other cooling apparatus 10 described in FIGS. 1 to 4 or the like. That is, the main flow Mf in this modification was used for cooling in the other cooling apparatus 10 provided on the upstream side and thus has a high amount of heat compared to the main flow Mf immediately after being generated from the fan 4.

The induced flow generation device 3 is provided on a surface 9a of a support member 9 in a state where an induced flow generation part 3a faces in the X-axis positive direction. Therefore, the flow of an induced flow If generated by the induced flow generation device 3 is generally parallel to the main flow Mf from the fan 4.

According to the configuration of this modification, the main flow Mf from the fan 4 is guided in the direction of the surface 9a of the support member 9 by the induced flow If from the induced flow generation part 3a. Therefore, it is possible to allow the center position Cf of the flow of the main flow Mf to approach the support member 9.

According to the cooling apparatus 10 of this modification described above, the induced flow generation device 3 is disposed so that the induced flow If is generated in the direction to guide the flow of the main flow Mf to the support member 9.

Consequently, it is possible to make the flow of the main flow Mf approach the support member 9 side so as to be away from a heat sink body 2 provided with the heat generating body 1 as a cooling object. Therefore, for example, when the main flow Mf has the heat due to already being used for cooling on the upstream side so that it is not preferable to apply the main flow Mf to the heat sink body 2 in terms of cooling, it is possible to make that flow get away from the heat sink body 2.

Further, the pressure distribution in an air layer 7 between the heat sink body 2 and the support member 9 can be changed as appropriate by making the flow of the main flow Mf approach the support member 9 side.

Further, according to the cooling apparatus 10 of this modification, the induced flow generation device 3 is disposed generally parallel to and generally in the same direction as the flow of the main flow Mf.

Consequently, the flow of the main flow Mf is guided along the flow direction of the induced flow If by the action of the induced flow If. Therefore, a specific way for making the flow of the main flow Mf approach the support member 9 side can be realized by the simple configuration, i.e. adjusting the arrangement of the induced flow generation device 3.

Further, in this embodiment, the induced flow generation device 3 is disposed at the downstream position (on the X-axis positive direction side in FIG. 5) of the heat generating body 1 in the flow direction of the main flow Mf.

Consequently, the action of the induced flow If that guides the main flow Mf, already used for cooling and having the heat, in the direction of the support member 9 can be exhibited upstream of the heat generating body 1. Since the main flow Mf is made to approach the support member 9 at the position upstream of the heat generating body 1 as described above, the main flow Mf is mixed with the fluid near the support member 9 where the heat transfer is not positively performed. As a result, it is possible to lower the temperature of the main flow Mf.

(Modification 1-3)

Figure 6:
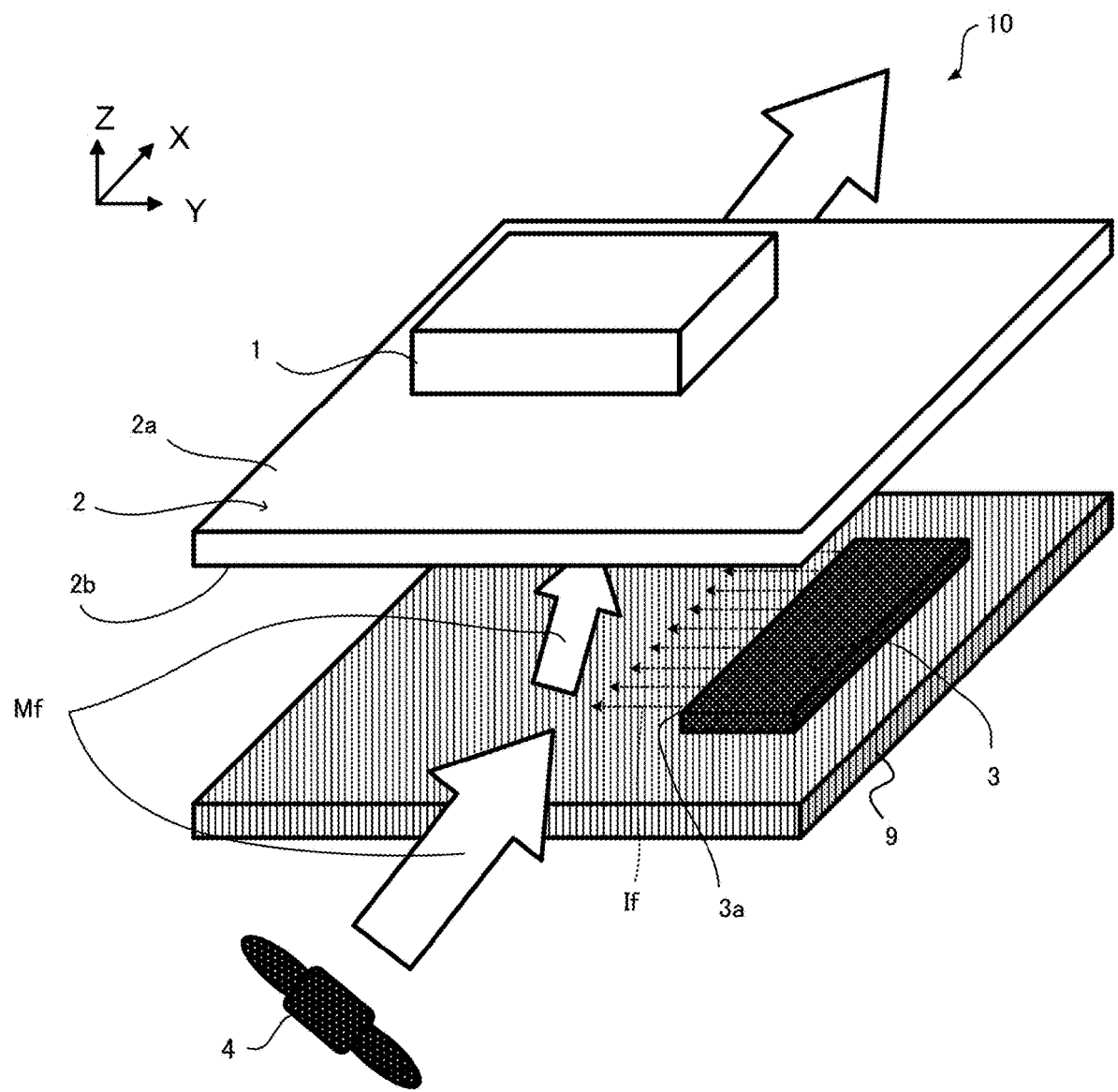
FIG. 6 is a perspective view for explaining the configuration of a cooling apparatus according to a modification 1-3.
Figure 7:
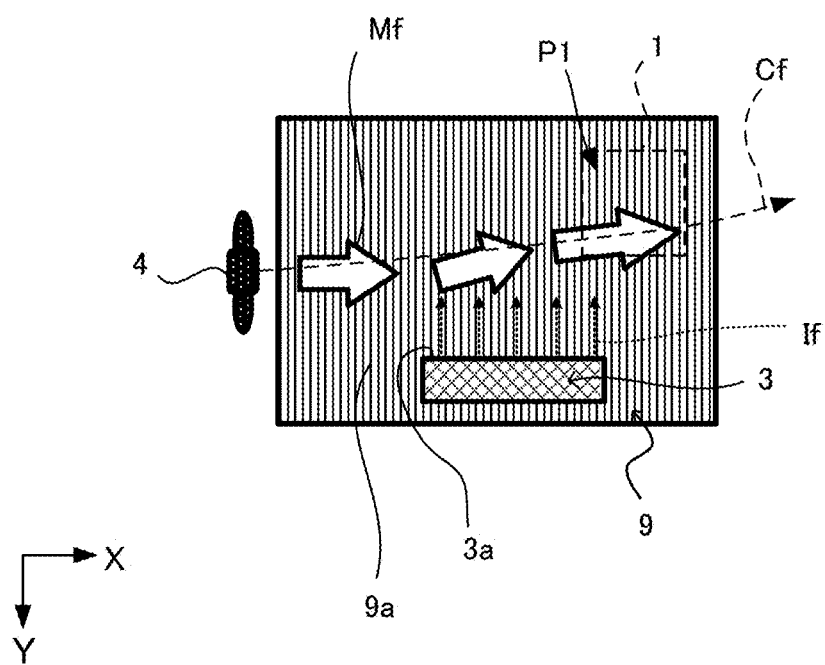
FIG. 7 is a main part plan view where a support member in FIG. 6 is viewed from the Z-axis positive direction side.

FIG. 6 is a perspective view of a cooling apparatus 10 according to the modification 1-3. FIG. 7 is a main part plan view where a support member 9 in FIG. 6 is viewed from the Z-axis positive direction side. As illustrated, in the cooling apparatus 10 according to this modification 1-3, an induced flow generation device 3 is provided on a surface 9a of the support member 9 in a state where an induced flow generation part 3a faces in the Y-axis negative direction.

A fan 4 is disposed so that the flow of a main flow Mf is along the X-axis positive direction like in the cooling apparatus 10 of FIG. 1. Further, a heat generating body 1 is disposed on a first surface 2a of a heat sink body 2 at a position offset in the X-axis positive direction and the Y-axis negative direction (a position on the left side and the far side of the sheet in FIG. 6).

According to the configuration of the cooling apparatus 10 of this modification, the flow of the main flow Mf and the flow of an induced flow If are generally perpendicular to each other, and the flow of the induced flow If is generally parallel to a second surface 2b of the heat sink body 2.

According to the cooling apparatus 10 of this modification described above, the induced flow generation device 3 and the fan 4 are disposed so that the flow of the main flow Mf and the flow of the induced flow If are generally perpendicular to each other, and that the flow of the induced flow If is generally parallel to the second surface 2b of the heat sink body 2.

Consequently, it is possible to change the flow direction of the main flow Mf by colliding the induced flow If against the main flow Mf. Therefore, it is possible to gather the flow of the main flow Mf in a portion where the amount of heat is relatively large and thus the need for cooling is high, thereby contributing to cooling more efficiently.

In particular, in this modification, the heat generating body 1 is provided on the first surface 2a at the position offset in the X-axis positive direction and the Y-axis negative direction. Consequently, it is possible to gather the flow of the main flow Mf at a nearby position of the second surface 2b facing the first surface 2a on which the heat generating body 1 is disposed (hereinafter also referred to as a "heat generating body facing position P1"), and therefore, it is possible to further improve the cooling efficiency.

According to the configuration of the cooling apparatus 10 of each of the first embodiment and the modifications 1-1 to 1-3, it is possible to adjust the flow of the main flow Mf to a desired direction by the action of the induced flow If according to an arrangement manner of the induced flow generation device 3 or the fan 4. Therefore, in an electronic device or the like including an electronic component that generates heat, such as a conductor, a semiconductor mold package, a capacitor, or a coil, it is possible to control the flow of the main flow Mf without providing a partition wall or the like for adjusting the path of the main flow Mf.

A cooling apparatus 10 including at least two of the induced flow generation devices 3 respectively described in the first embodiment and the modifications 1-1 to 1-3 may be configured. That is, a cooling apparatus 10 optionally including at least two of the induced flow generation device 3 described in FIGS. 1 to 3, the induced flow generation device 3 described in FIG. 4, and the induced flow generation device 3 described in FIGS. 6 and 7 may be configured. Consequently, it is possible to realize a suitable cooling apparatus 10 according to a use.

Second Embodiment

A second embodiment will be described below. The same symbols are given to the same elements as those of the first embodiment, and a description thereof is omitted.

Figure 8:
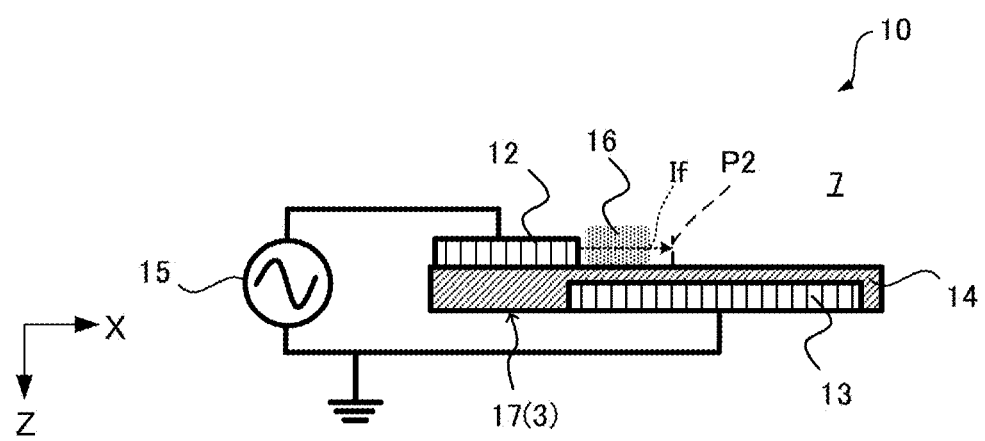
FIG. 8 is a sectional view for explaining the configuration of a plasma actuator according to a second embodiment.

FIG. 8 is a sectional view for explaining the configuration of a plasma actuator 17 according to the second embodiment.

As illustrated, the plasma actuator 17 is configured such that a dielectric 14 is sandwiched between a first electrode 12 and a second electrode 13 grounded. The plasma actuator 17 is connected to a power supply device 15. Predetermined insulating layers are applied to upper and lower portions of the plasma actuator 17.

The first electrode 12 and the second electrode 13 are provided at positions offset from each other in the Z-axis direction. The first electrode 12 and the second electrode 13 are made of a metallic material such as copper, aluminum, or iron. The first electrode 12 and the second electrode 13 are each formed by, for example, a copper tape with a thickness of several hundred μm order.

The dielectric 14 is made of a predetermined insulating material. In particular, as this insulating material, it is preferable to employ polytetrafluoroethylene, polyimide, or nylon in terms of resistance to high voltage and high insulation. With these insulating materials, it is possible to ensure resistance to a high voltage of about several kV even with the thickness of several hundred μm order.

Figure 23:
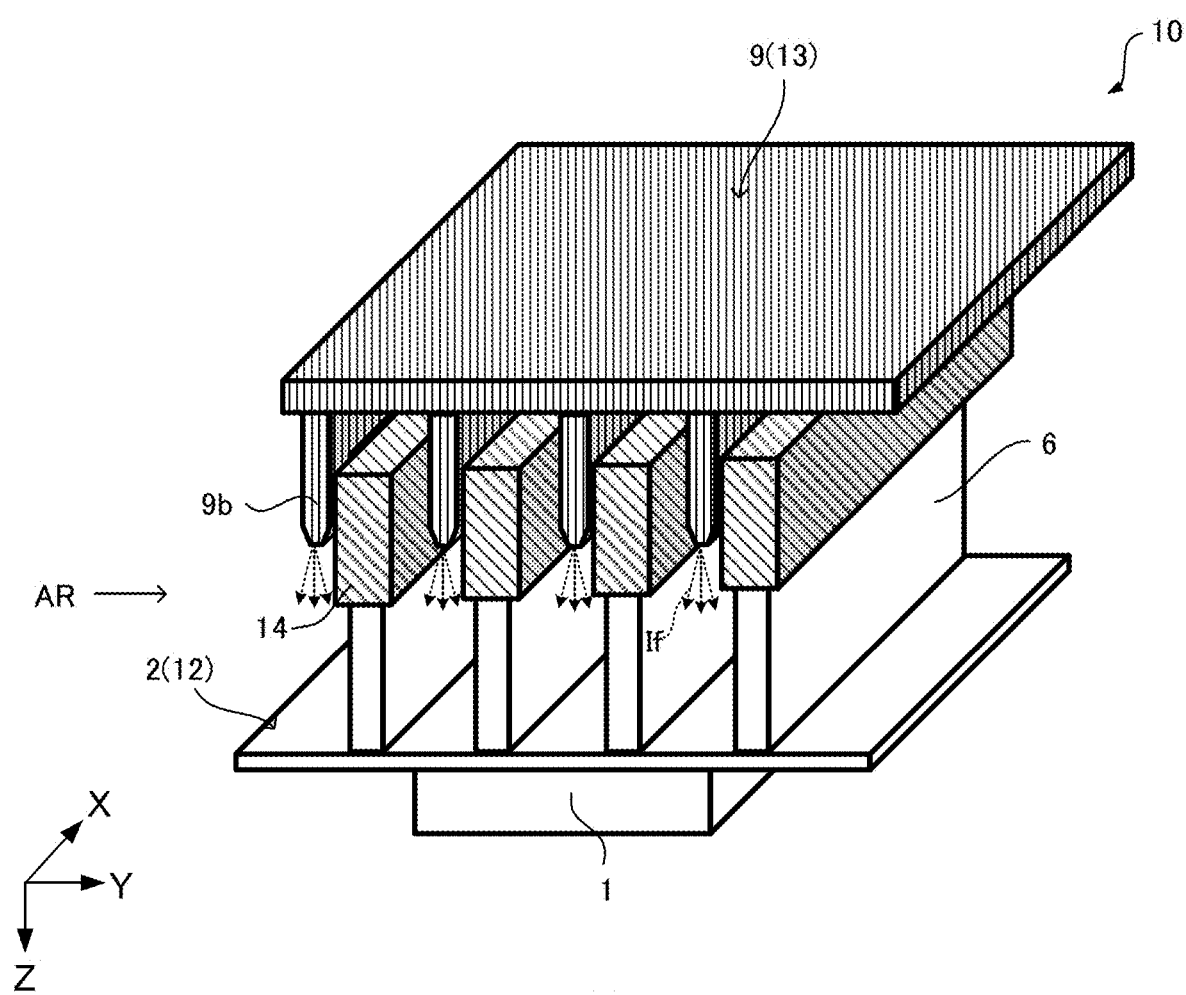
FIG. 23 is a main part perspective view for explaining the configuration of a cooling apparatus according to a modification 4-7.

The second electrode 13 and the dielectric 14 are provided offset from each other in the Y-axis direction (the direction perpendicular to the sheet in FIG. 23). That is, the second electrode 13 and the dielectric 14 are provided so as not to overlap each other in the Z-axis direction.

The plasma actuator 17 of this embodiment is configured such that its total thickness in the Z-axis direction is, for example, equal to or less than about 1 mm.

The power supply device 15 is formed by an AC power supply and connected to the first electrode 12 and the second electrode 13 of the plasma actuator 17. That is, the power supply device 15 applies an AC voltage to the plasma actuator 17 to produce a plasma atmosphere 16 from the first electrode 12 toward the X-axis positive direction side. Ions in the plasma atmosphere 16 electrically act on and move air molecules so that it is possible to generate an induced flow If that flows along the X-axis positive direction. That is, the first electrode 12 functions as an induced flow generation part 3a.

Herein, the induced flow If that is generated by the plasma actuator 17 is generated from the first electrode 12 in the X-axis positive direction, and in particular, the flow velocity of the induced flow If becomes the maximum at a position P2 spaced apart from the plasma atmosphere 16 by a predetermined distance in the X-axis positive direction. This is because the body force by the Coulomb force is produced on charged particles in the plasma atmosphere 16 so that the charged particles start to be accelerated and reach a constant speed at the position spaced apart by the predetermined distance.

The predetermined distance from the plasma atmosphere 16 where the induced flow If described above is generated is, for example, several mm to several cm although it differs depending on the frequency of applied AC voltage of the power supply device 15, the electrode material, and the material of the dielectric 14.

For example, when the applied voltage (the effective value of the applied AC voltage) of the power supply device 15 is about several kV and its AC frequency is equal to or less than about 20 kHz, the position P2 is a position spaced apart from the plasma atmosphere 16 by about 2 cm.

Therefore, it is preferable that the installation position of the plasma actuator 17 be adjusted as appropriate by taking into account the position P2 where the flow velocity of the induced flow If becomes the maximum.

Figure 9:
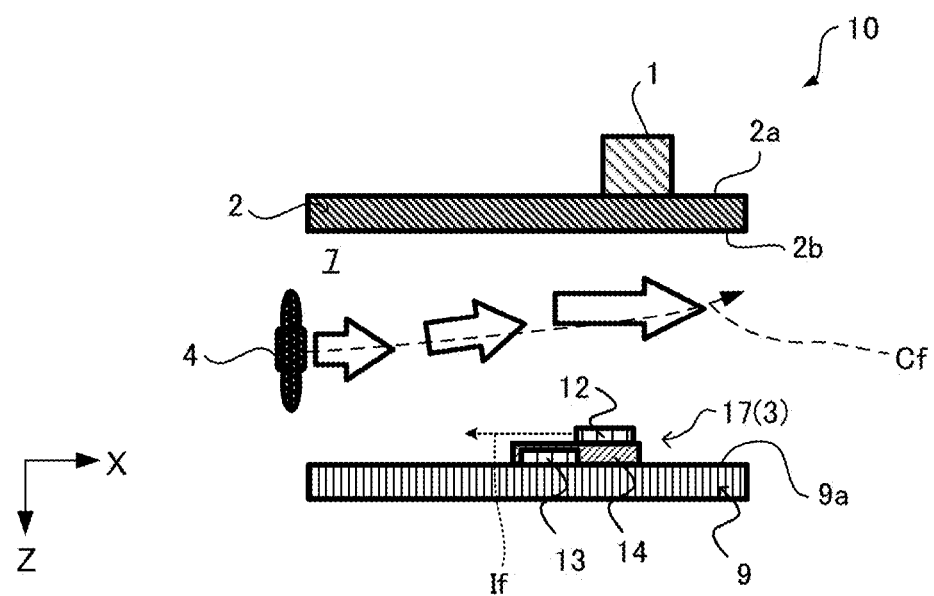
FIG. 9 is a sectional view for explaining the configuration of a cooling apparatus provided with the plasma actuator.

FIG. 9 is a sectional view for explaining the configuration of a cooling apparatus 10 provided with the plasma actuator 17.

As illustrated, the cooling apparatus 10 of this embodiment is configured to employ the plasma actuator 17 as the induced flow generation device 3 of the cooling apparatus 10 described in FIG. 1. More specifically, the second electrode 13 and the dielectric 14 are connected to a surface 9a of a support member 9. An insulating member may be provided as appropriate between the plasma actuator 17 and the surface 9a of the support member 9.

In this way, by employing the plasma actuator 17 as the induced flow generation device 3 of the cooling apparatus 10, the induced flow generation device 3 can be formed to be relatively thin. Consequently, it is possible to more properly suppress a situation where the plasma actuator 17 itself impedes the flow of the fluid along a second surface 2b of a heat sink body 2.

Further, with the plasma actuator 17, it is possible to electrically control the induced flow If. More specifically, by switching on/off of power supply by the power supply device 15, it is possible to switch between a state of generating the induced flow If and a state of not generating the induced flow If. By this switching of on/off of power supply, it is possible to disturb the flow of a main flow Mf to facilitate the turbulence, thereby improving the heat transfer. Further, in a situation where there is no need to generate the induced flow If, the power supply may be kept in an off state so that it is possible to suppress the occurrence of pressure loss due to the action of the induced flow If. Further, by adjusting as appropriate the magnitude of the applied voltage by the power supply device 15, it is possible to adjust the flow velocity and flow rate of the induced flow If.

In the cooling apparatus 10 of this embodiment, the plasma actuator 17 is provided to the support member 9 separate from the heat sink body 2 to which a heat generating body 1 is joined. Therefore, it is suppressed that the heat due to power loss caused by the operation of the plasma actuator 17 is transferred to near the heat generating body 1.

According to the cooling apparatus 10 of this embodiment having the configuration described above, the following operations and effects are exhibited.

In the cooling apparatus 10 of this embodiment, the induced flow generation device 3 includes the plasma actuator 17 configured such that the dielectric 14 is disposed between the first electrode 12 and the second electrode 13.

Consequently, without causing a large increase in the size and volume of the entire cooling apparatus 10, it is possible to realize the configuration that generates the induced flow If that facilitates the cooling of the heat generating body 1. In particular, since the plasma actuator 17 can be formed to be relatively small, it is possible to more properly suppress a situation where the induced flow generation device 3 itself impedes the flow of the fluid along the second surface 2b of the heat sink body 2.

In particular, the heat is generated due to the operation of the plasma actuator 17. In this regard, since the cooling apparatus 10 of this embodiment is configured such that the plasma actuator 17 is provided to the support member 9 separate from the heat sink body 2 to which the heat generating body 1 is joined, it is possible to suppress thermal interference between the plasma actuator 17 and the heat generating body 1.

Further, a region where the induced flow If is generated can be made relatively small by the electrical control or the selection of constituent materials of the plasma actuator 17. Therefore, the configuration that generates the flow for the cooling is realized while reducing the influence on the pressure loss of the entire cooling apparatus 10.

Further, the cooling apparatus 10 of this embodiment further includes the power supply device 15 as the control device that controls the magnitude and frequency of the AC voltage applied to the plasma actuator 17.

Consequently, it is possible to electrically control the flow velocity and flow rate of the induced flow If by the power supply device 15. Therefore, by adjusting the flow velocity and flow rate of the induced flow If by the power supply device 15, the flow (the center position Cf of the flow) of the main flow Mf can also be adjusted as appropriate. Consequently, it is possible to control the flow of the main flow Mf with high responsiveness compared to an existing passive component such as a partition wall (the structure of a flow path or the like), and further, the real-time control according to a state of the heat generating body 1 or the cooling apparatus 10 is made possible.

Further, in this embodiment, the plasma actuator 17 is disposed at a position spaced apart from the heat generating body 1 by a predetermined distance, corresponding to a position of the second surface 2b facing the heat generating body 1 joined to a first surface 2a of the heat sink body 2 (a heat generating body facing position P1).

Consequently, since the induced flow If in a state where the flow velocity is high can be applied to a portion of the heat sink body 2 where the amount of heat is relatively large, it is possible to perform the cooling more efficiently. In particular, in this embodiment, since the center position Cf of the heat generating body 1 is disposed at the position P2 where the flow velocity of the induced flow If generated by the plasma actuator 17 becomes the maximum, the efficiency of the cooling is further enhanced. Further, since the plasma actuator 17 and the heat generating body 1 are disposed to be spaced apart from each other, the thermal interference to the heat generating body 1 due to the heat generation of the plasma actuator 17 can also be suppressed.

Figure 10:
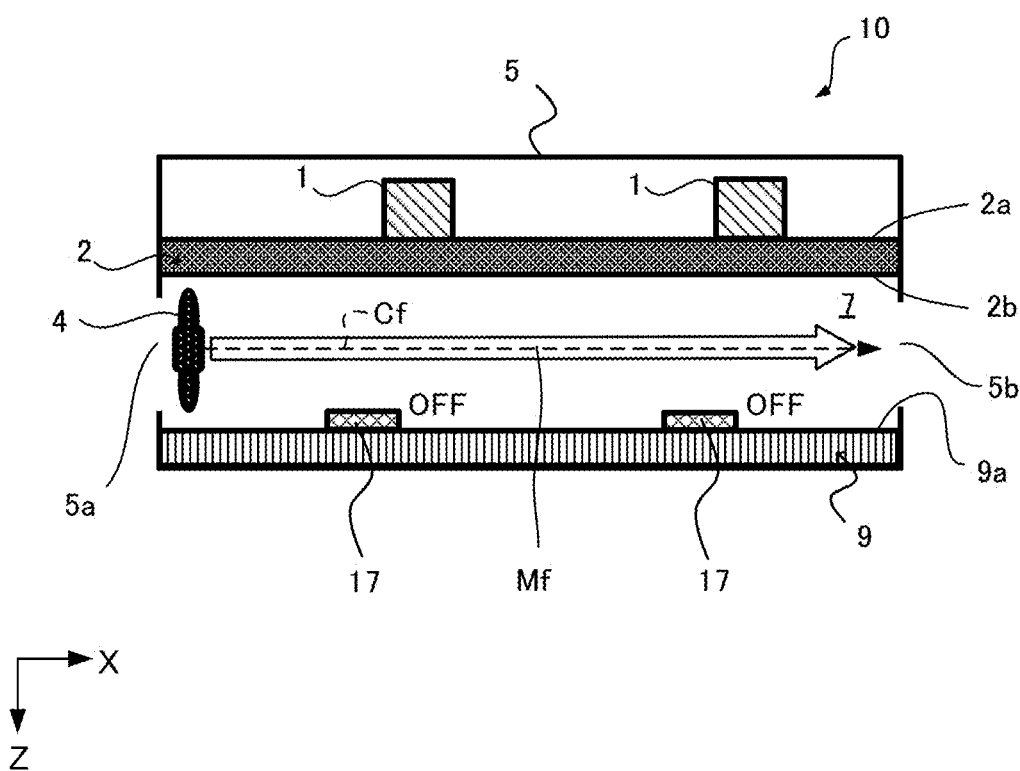
FIG. 10 is a sectional view for explaining the configuration of a cooling apparatus (plasma actuators are in an off state) according to a modification 2-1.
Figure 11:
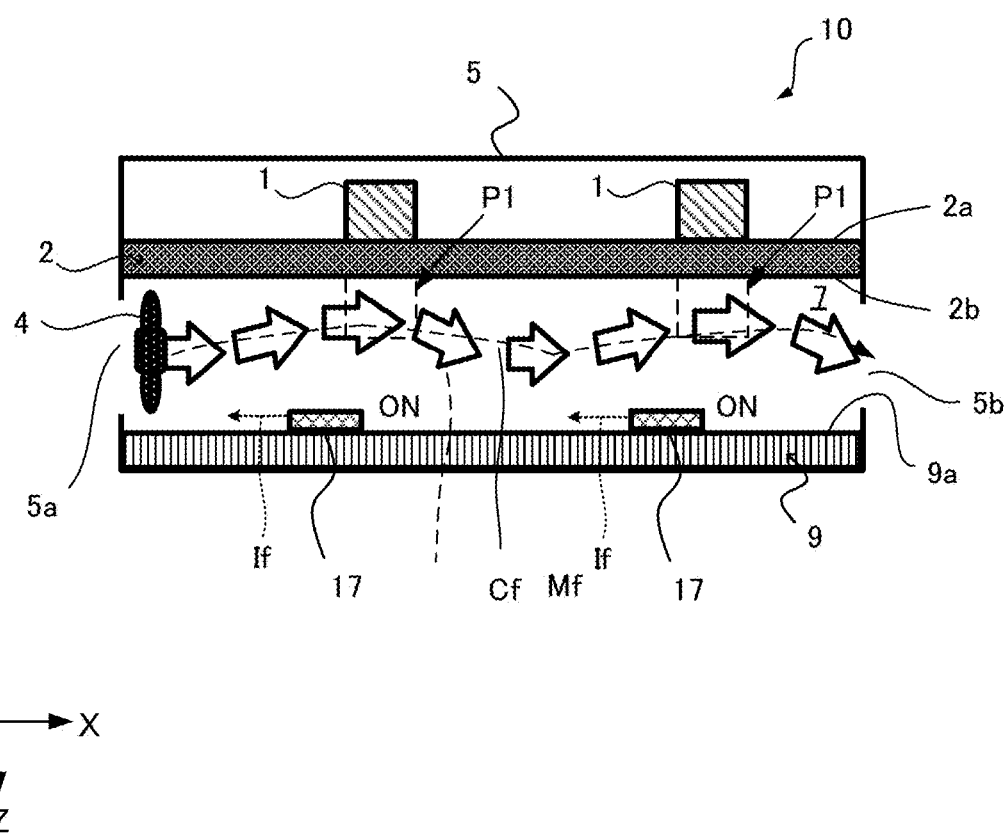
FIG. 11 is a sectional view for explaining the configuration of the cooling apparatus (the plasma actuators are in an on state) according to the modification 2-1.

A modification 2-1 of the second embodiment will be described below. In FIGS. 10 and 11 for describing the modification 2-1, the specific configurations of the plasma actuator 17, such as the first electrode 12, the second electrode 13, and the dielectric 14 described above, are not illustrated for the simplicity of the drawings.

(Modification 2-1)

FIGS. 10 and 11 are sectional views for explaining the configuration of a cooling apparatus 10 according to the modification 2-1. In particular, FIG. 10 illustrates the cooling apparatus 10 in a case where a fan 4 is generating a main flow Mf and plasma actuators 17 are in an off state (a state where AC voltage is not applied). FIG. 10 illustrates the cooling apparatus 10 in a case where the fan 4 is generating a main flow Mf and the plasma actuators 17 are in an on state (a state where AC voltage is applied).

As illustrated, the cooling apparatus 10 of this modification is configured such that a heat sink body 2, the plasma actuators 17, the fan 4, and a support member 9 are housed in a case 5. Although not illustrated, a power supply device 15 is, for example, disposed outside the case 5 and wire-connected to the plasma actuators 17 through a wiring hole of the case 5.

The case 5 is made of a metallic material or a resin material. In particular, when heat generating bodies 1 are electronic components and the case 5 is made of the metallic material such as aluminum, it is preferable to apply an insulation treatment such as an alumite treatment to the surface of the case 5. The support member 9 of this embodiment is provided in a lower portion (an end on the Z-axis positive direction side) of the case 5 in FIGS. 10 and 11. More specifically, the support member 9 forms one wall surface of the case 5.

In the cooling apparatus 10 of this modification, the main flow Mf is taken in through an inlet 5a of the case 5 on the left side in the figure by the operation of the fan 4. Then, the main flow Mf taken in is used for cooling the heat sink body 2 in the case 5 and discharged from an outlet 5b of the case 5.

Therefore, with the configuration of this modification, it is possible to allow the main flow Mf from the fan 4 and induced flows If to flow to an air layer 7 between a second surface 2b of the heat sink body 2 and a surface 9a of the support member 9 while maintaining them in the case 5 without spreading. Consequently, it is possible to perform heat transfer between the heat sink body 2 and the air layer 7 more efficiently so that the cooling performance is further improved. Further, exposure, electric shock, or the like from the outside can be prevented by the case 5 more reliably.

In this modification, the plurality of heat generating bodies 1 and the plurality of plasma actuators 17 (two for each in FIGS. 10 and 11) are provided to the heat sink body 2 and the support member 9, respectively. In particular, the plasma actuators 17 are respectively provided at upstream positions in the flow direction of the main flow Mf (offset positions in the X-axis negative direction) with respect to the corresponding heat generating bodies 1. Further, the plasma actuators 17 are disposed so as to flow the induced flows If in the direction generally opposite to the flow of the main flow Mf (the X-axis negative direction).

According to this modification, even when the heat generating bodies 1 as the cooling objects are provided in plurality, by providing the plasma actuators 17 respectively corresponding thereto, it is possible to generate the induced flows If so as to guide the flow of the main flow Mf to respective heat generating body facing positions P1 for the heat generating bodies 1. Consequently, more efficient cooling is realized.

In the off state of the plasma actuators 17 (see FIG. 10), the center position Cf of the flow of the main flow Mf is maintained generally at the center in the Z-axis direction between the heat sink body 2 and the support member 9. That is, this is a state where the flow of the main flow Mf is not affected by the induced flows If so that the occurrence of turbulence is suppressed and thus the pressure loss is suppressed.

On the other hand, when the plasma actuators 17 are in the on state (see FIG. 11), it is possible to obtain the action that guides the flow of the main flow Mf to the respective heat generating body facing positions P1 for the heat generating bodies 1.

Therefore, it is possible to control the flow of the main flow Mf in real time by switching between the on state and the off state of the plasma actuators 17 as needed.

Further, in the cooling apparatus 10 of this modification, the support member 9 is configured as a part of the case 5 housing the heat sink body 2.

In this way, by housing the heat sink body 2 in the case 5, it is possible to efficiently perform the cooling by suppressing the spreading of the main flow Mf and the induced flows If. Further, it is possible to shield from the outside the components with relatively high voltage, such as the plasma actuators 17 provided to the support member 9 or the heat generating bodies 1 such as the electronic components joined to the heat sink body 2 so that it is possible to prevent exposure, electric shock, or the like more reliably.

Further, since a part of the case 5 is configured as the support member 9, it is possible to reduce a space compared to a case where the support member 9 is separately configured in the case 5. As a result, this also contributes to a reduction in the size of the entire cooling apparatus 10.

Third Embodiment

A third embodiment will be described below. The same symbols are given to the same elements as those of the first embodiment and the second embodiment, and a description thereof is omitted.

Figure 12:
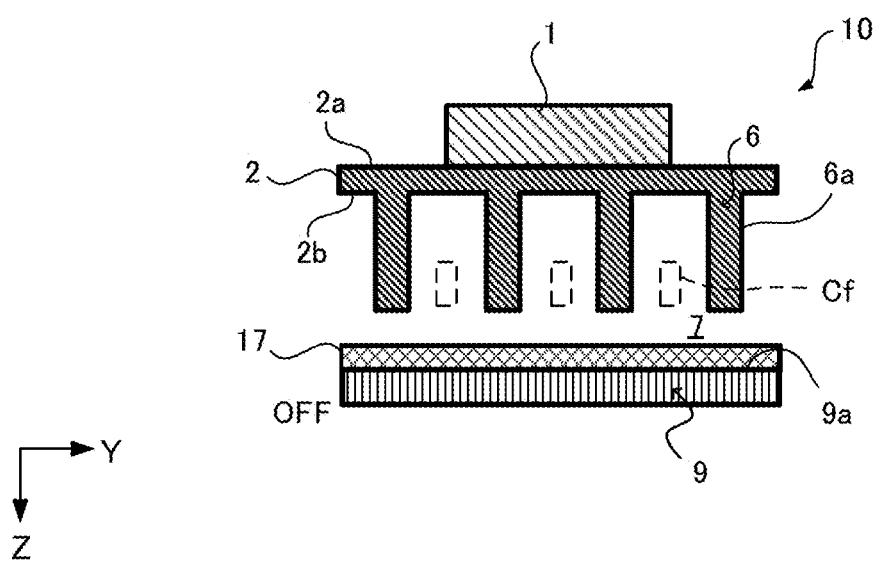
FIG. 12 is a sectional view for explaining the configuration of a cooling apparatus (a plasma actuator is in an off state) according to a third embodiment.
Figure 13:
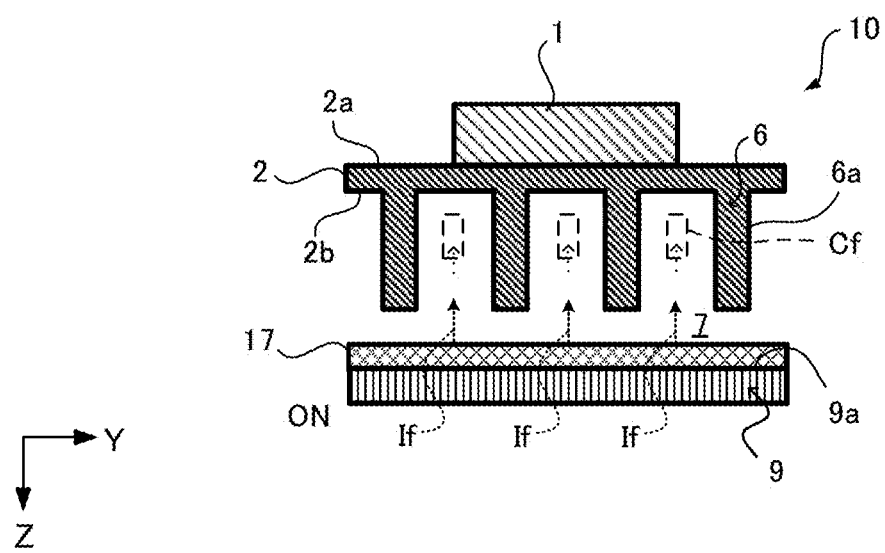
FIG. 13 is a sectional view for explaining the configuration of the cooling apparatus (the plasma actuator is in an on state) according to the third embodiment.

FIGS. 12 and 13 are sectional views for explaining the configuration of a cooling apparatus 10 according to the third embodiment. In particular, FIG. 12 illustrates the cooling apparatus 10 in a case where a fan 4 is generating a main flow Mf and a plasma actuator 17 is in an off state (a state where AC voltage is not applied). FIG. 13 illustrates the cooling apparatus 10 in a case where the fan 4 is generating a main flow Mf and the plasma actuator 17 is in an on state (a state where AC voltage is applied). In FIGS. 12 and 13, the specific configurations of the plasma actuator 17, such as the first electrode 12, the second electrode 13, and the dielectric 14 described above, are not illustrated for the simplicity of the drawings.

In the cooling apparatus 10 according to this embodiment, a second surface 2b of a heat sink body 2 is provided with heat dissipation fins 6.

The heat dissipation fin 6 is a member that dissipates the heat, transferred from a heat generating body 1 through the heat sink body 2, from its surface 6a to an air layer 7. That is, the heat dissipation fin 6 is a structure configured for the purpose of increasing a heat transfer region (surface area) between the heat sink and the air layer 7.

The heat dissipation fin 6 is formed in a generally rectangular shape in section extending downward in FIGS. 12 and 13, i.e. toward a support member 9, from the second surface 2b of the heat sink body 2. The heat dissipation fins 6 of this embodiment are provided in plurality (four in FIGS. 12 and 13) at an almost constant pitch along the Y-axis direction and formed in a comb teeth shape as a whole.

The heat dissipation fin 6 is made of a material the same as or different from that of the heat sink body 2. That is, the heat dissipation fin 6 is made of, for example, a metallic material with a relatively high thermal conductivity, such as copper or aluminum, or a non-metallic material with a relatively high thermal conductivity, such as FR4 or ceramic.

When the heat sink body 2 is formed of a conductive material such as a metal, by forming the heat dissipation fin 6 of a non-conductive material with a relatively high thermal conductivity, the insulation function can be provided while ensuring the heat conduction performance between the heat sink body 2 and the heat dissipation fin 6. On the other hand, when the insulation function is ensured for the heat generating body 1 because of the heat sink body 2 being made of an insulating material or the like, it is preferable to form the heat dissipation fin 6 of a material with a relatively high thermal conductivity and a low cost, such as aluminum.

Although not illustrated in FIGS. 12 and 13, in the cooling apparatus 10 of this embodiment, like in the cooling apparatus 10 described in FIG. 1, the fan 4 is provided in the vicinity of one end portion of the heat sink body 2 in the X-axis direction. Therefore, the main flow Mf from the fan 4 flows from this side of the sheet to the far side of the sheet in FIGS. 12 and 13 through flow paths each being a part of a space defined by the adjacent heat dissipation fins 6.

Herein, in the cooling apparatus 10 according to this embodiment, in the off state of the plasma actuator 17 illustrated in FIG. 12, the center position Cf of the flow of the main flow Mf formed between the adjacent heat dissipation fins 6 is generally at the center in the Z-axis direction between the heat sink body 2 and the support member 9. That is, this is a state where the flow of the main flow Mf is not affected by an induced flow If so that the occurrence of turbulence is suppressed and thus the pressure loss is suppressed.

On the other hand, in the on state of the plasma actuator 17 illustrated in FIG. 13, the flow of the main flow Mf between the adjacent heat dissipation fins 6 is guided in the direction of the heat sink body 2 by the action of the induced flow If. Consequently, it is possible to make the center position Cf of the flow of the main flow Mf approach the heat sink body 2 (see dotted line arrows in FIG. 13).

According to this embodiment having the configuration described above, the following operations and effects are exhibited.

The heat sink body 2 in the cooling apparatus 10 according to this embodiment further includes the heat dissipation fins 6 provided to the second surface 2b as the back surface of a first surface 2a being a surface to which the heat generating body 1 is joined.

Consequently, it is possible to further improve the cooling performance by increasing the heat transfer area between the heat sink and the air layer 7 with the simple configuration.

In the cooling apparatus 10 of this embodiment, the plasma actuator 17 is provided on a surface 9a of the support member 9, and the heat dissipation fins 6 extend from the heat sink body 2 toward the support member 9, and therefore, the plasma actuator 17 provided to the support member 9 is disposed to be closer to the heat dissipation fins 6 than to the heat sink body 2. Therefore, the flow path of the main flow Mf formed between the adjacent heat dissipation fins 6 is relatively close to the plasma actuator 17 being the generation source of the induced flow If. Consequently, it is possible to more properly perform the control of the main flow Mf by the induced flow If so that it is possible to further improve the cooling performance.

In the cooling apparatus 10 of this embodiment, the heat dissipation fins 6 are provided in plurality in the comb teeth shape.

Consequently, flow paths of the induced flow If can be defined between the heat dissipation fins 6 arranged in the comb teeth shape, and therefore, by adjusting as appropriate the arrangement interval and the size (the width in the Y-axis direction, the length in the X-axis direction, etc.) of the heat dissipation fins 6, it is possible to configure desired flow paths of the induced flow If on the second surface 2b of the heat sink body 2.

Instead of the heat dissipation fins 6 provided in plurality in the comb teeth shape according to this modification, one or a plurality of protruding heat dissipation fins 6 having a generally square prism shape, a generally cylindrical shape, or another optional shape (a polygonal prism shape, a conical shape, a polygonal pyramid shape, or the like) may be provided to the heat sink body 2. That is, the heat dissipation fin 6 may be formed in a protruding manner.

Consequently, the direction of the induced flow If is changed due to collision with the protruding heat dissipation fin 6.

Therefore, by disposing the heat dissipation fin 6 at a proper position on the second surface 2b of the heat sink body 2, it is possible to change the flow directions of the main flow Mf and the induced flow If as appropriate. As a result, it is possible to further facilitate the heat transfer between the heat sink body 2 or the heat dissipation fin 6 and the air layer 7.

In particular, with the protruding heat dissipation fin 6, it is possible to generate the turbulence (three-dimensional flow) by disturbing the main flow Mf and the induced flow If so that it is possible to suppress the growth of a boundary layer (a heat insulating layer) due to a reduction in flow velocity near the second surface 2b of the heat sink body 2 or the surface 6a of the heat dissipation fin 6.

In the second embodiment and the third embodiment described above, the description has been given of the example in which the plasma actuator 17 is disposed so as to guide the flow of the main flow Mf in the direction of the heat sink body 2. However, the plasma actuator 17 may be disposed so as to guide the flow of the main flow Mf in the direction of the support member 9. More specifically, the plasma actuator 17 may be employed as the induced flow generation device 3 of the cooling apparatus 10 described in FIG. 5.

Fourth Embodiment

A fourth embodiment will be described below. The same symbols are given to the same elements as those of the first embodiment to the third embodiment, and a description thereof is omitted. In this embodiment, a description will be given of another example of the cooling apparatus 10 employing as the induced flow generation device 3 the plasma actuator 17 described in FIG. 8. In particular, in this embodiment, a description will be given of the configuration of a cooling apparatus 10 in which a second electrode 13 of a plasma actuator 17 is configured in a heat sink (a heat sink body 2 and heat dissipation fins 6), and a first electrode 12 of the plasma actuator 17 is configured in a support member 9.

Figure 14:
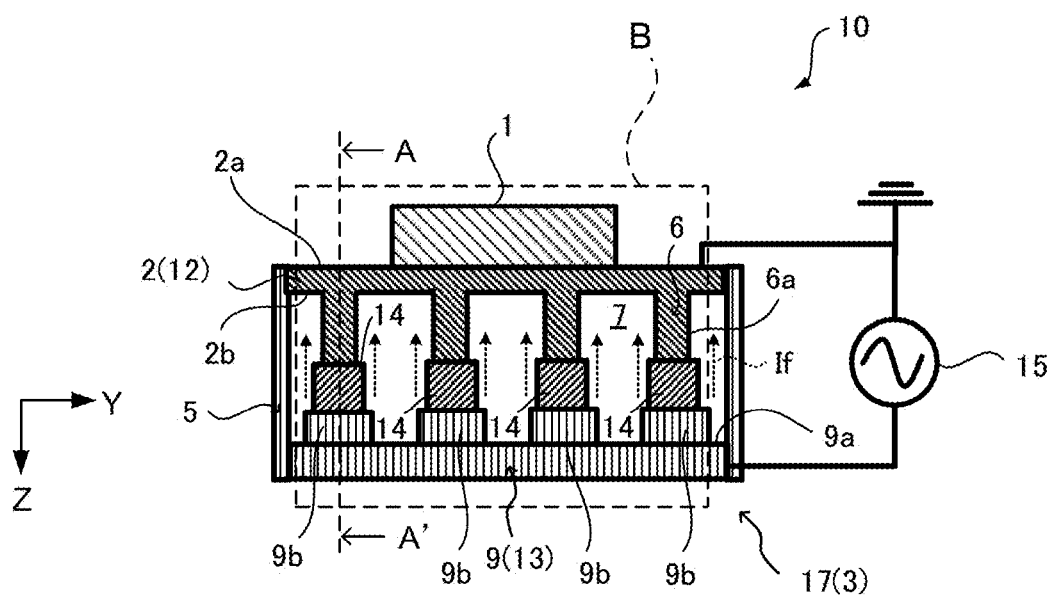
FIG. 14 is a sectional view for explaining the configuration of a cooling apparatus according to a fourth embodiment.
Figure 15:
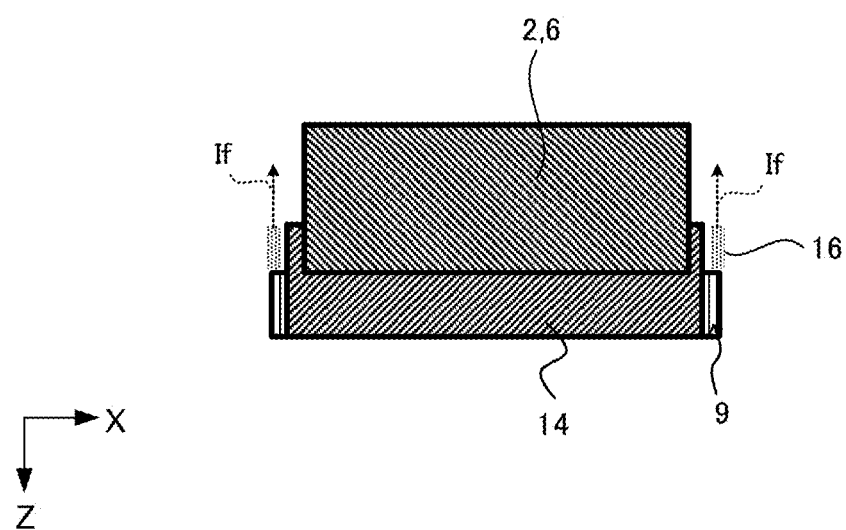
FIG. 15 is a sectional view taken along the line A-A' in FIG. 14.
Figure 16:
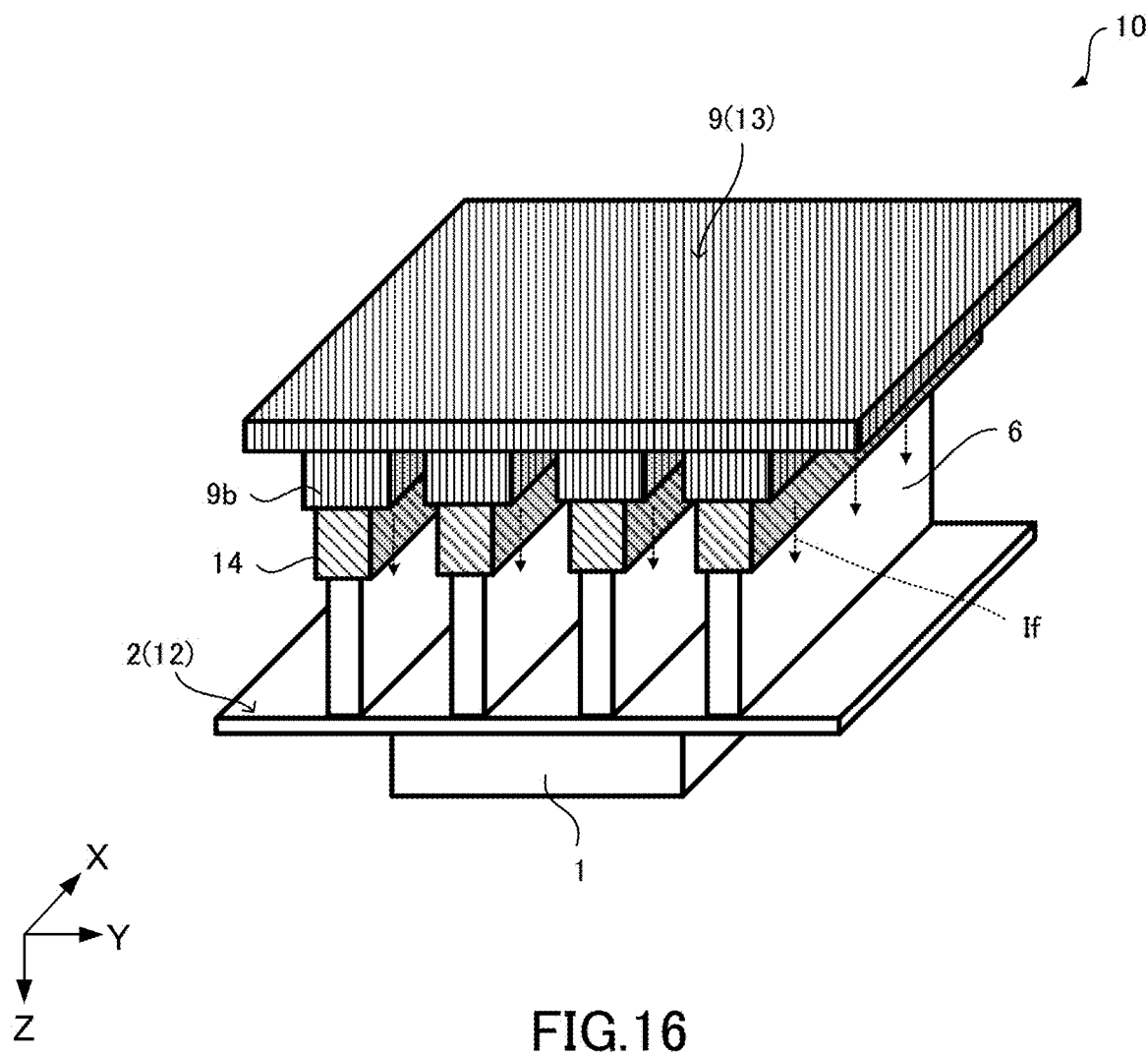
FIG. 16 is a main part perspective view of the cooling apparatus of FIG. 14.

FIG. 14 is a sectional view for explaining the configuration of the cooling apparatus 10 according to this embodiment. FIG. 15 is a sectional view taken along the line A-A' in FIG. 14. Further, FIG. 16 is a perspective view of a region surrounded by a dotted line B in FIG. 14.

As illustrated, the cooling apparatus 10 according to this embodiment uses as a basis the configuration described in FIGS. 12 and 13 and is configured such that projections 9b are formed on a surface 9a of the support member 9 so as to respectively face the heat dissipation fins 6. Dielectrics 14 are respectively provided between the heat dissipation fins 6 and the projections 9b.

The heat sink body 2 and the heat dissipation fins 6 of this embodiment are made of a metallic material and connected to a ground potential and function as the second electrode 13. On the other hand, the support member 9 is electrically connected to a power supply device 15 and functions as the first electrode 12. Consequently, the power supply device 15 applies an AC voltage between the support member 9 and the heat sink body 2/the heat dissipation fins 6 so that these operate as the plasma actuator 17.

Therefore, induced flows If heading in the direction of the heat sink body 2 from the dielectrics 14 into an air layer 7 are generated by a voltage difference generated between the support member 9 and the heat sink body 2/the heat dissipation fins 6. As a result, with the configuration of the cooling apparatus 10 of this embodiment, it is possible to generate the induced flows If that control the flow of a main flow Mf, particularly the induced flows If that guide the flow of the main flow Mf toward the heat sink body 2.

According to this embodiment having the configuration described above, the following operations and effects are exhibited.

In this embodiment, the cooling apparatus 10 employing as the induced flow generation device 3 the plasma actuator 17 described in FIG. 8 is provided. The first electrode 12 is configured in the heat sink (the heat sink body 2 and the heat dissipation fins 6), and the second electrode 13 is configured in the support member 9.

Consequently, since the first electrode 12 and the second electrode 13 of the plasma actuator 17 are formed integrally with the support member 9 and the heat sink, respectively, the configuration for generating the induced flows If can be realized simply and at a low cost without providing additional electrodes.

In particular, the cooling apparatus 10 of this embodiment is configured such that the heat sink (the heat sink body 2 and the heat dissipation fins 6) is at the ground potential and that the potential of the support member 9 varies.

Consequently, when a heat generating body 1 is an electronic component, since the heat sink side is at the ground potential, it is possible to suppress the influence of voltage fluctuation due to the operation of the plasma actuator 17. Further, the insulation design between the heat sink and the heat generating body 1 becomes easy.

Modifications 4-1 to 4-7 of the fourth embodiment will be described below. The following modifications 4-1 to 4-7 each exemplify a specific configuration that can be selected as appropriate by taking into account the flow directions of a main flow Mf and an induced flow If, the cooling performance, the insulation performance, the output performance of a fan 4, and the pressure loss that are required.

(Modification 4-1)

Figure 17:
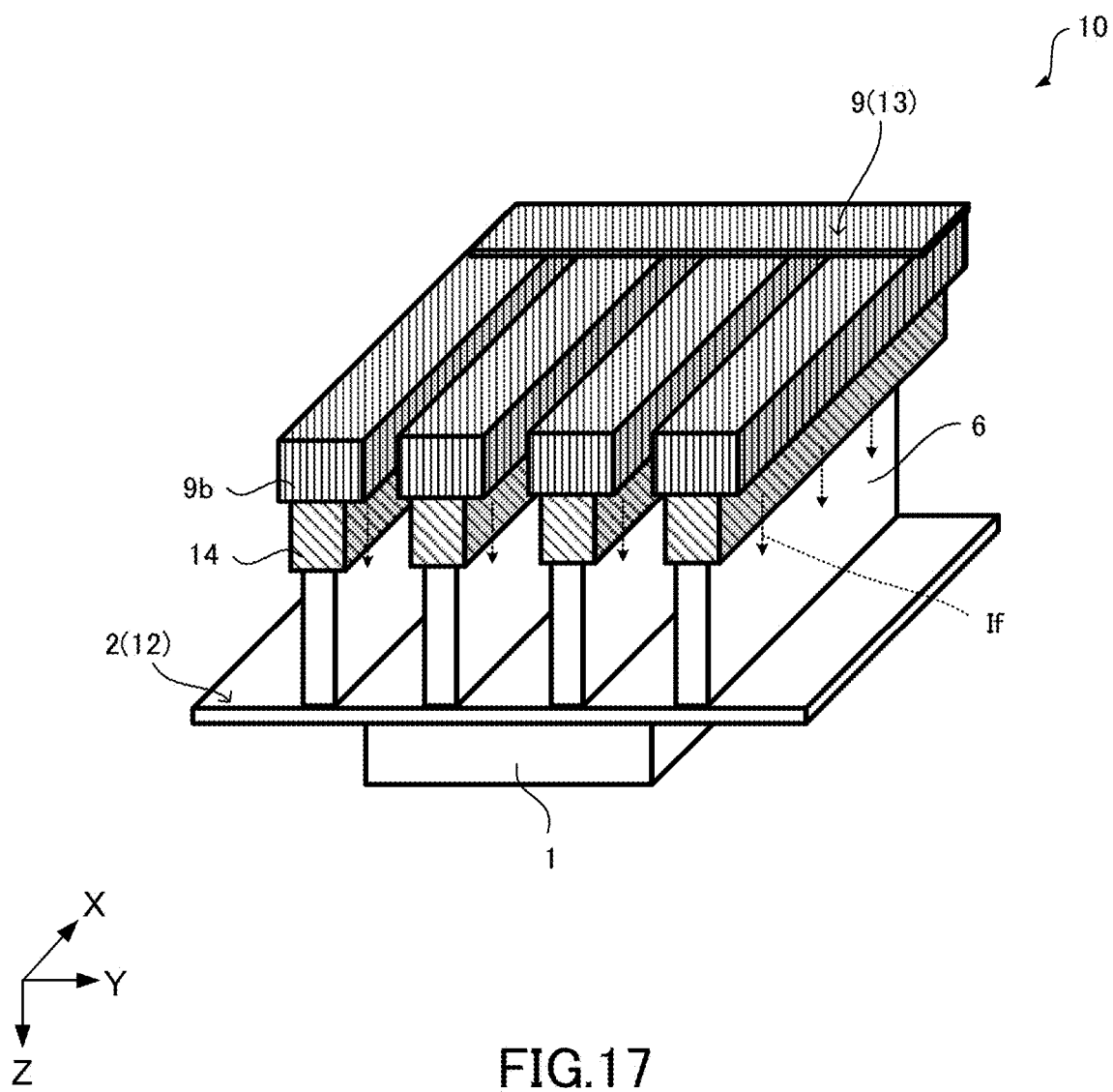
FIG. 17 is a main part perspective view for explaining the configuration of a cooling apparatus according to a modification 4-1.

FIG. 17 is a main part perspective view of a cooling apparatus 10 according to the modification 4-1. As illustrated, in the cooling apparatus 10 according to this modification, compared to the configuration of the cooling apparatus 10 described in FIG. 16, a support member 9 is configured such that an extending region, in the X-axis direction, of a surface portion forming a surface 9a is formed to be shorter than an extending region of projections 9b in the X-axis direction. Specifically, in the example illustrated in FIG. 17, the extending region of the surface portion of the support member 9 in the X-axis direction is formed to be about ⅕ to ⅙ of the extending region of the projections 9b in the X-axis direction. With this configuration, it is possible to generate induced flows If flowing downward in the figure (the Z-axis positive direction) from the projections 9b of the support member 9.

(Modification 4-2)

Figure 18:
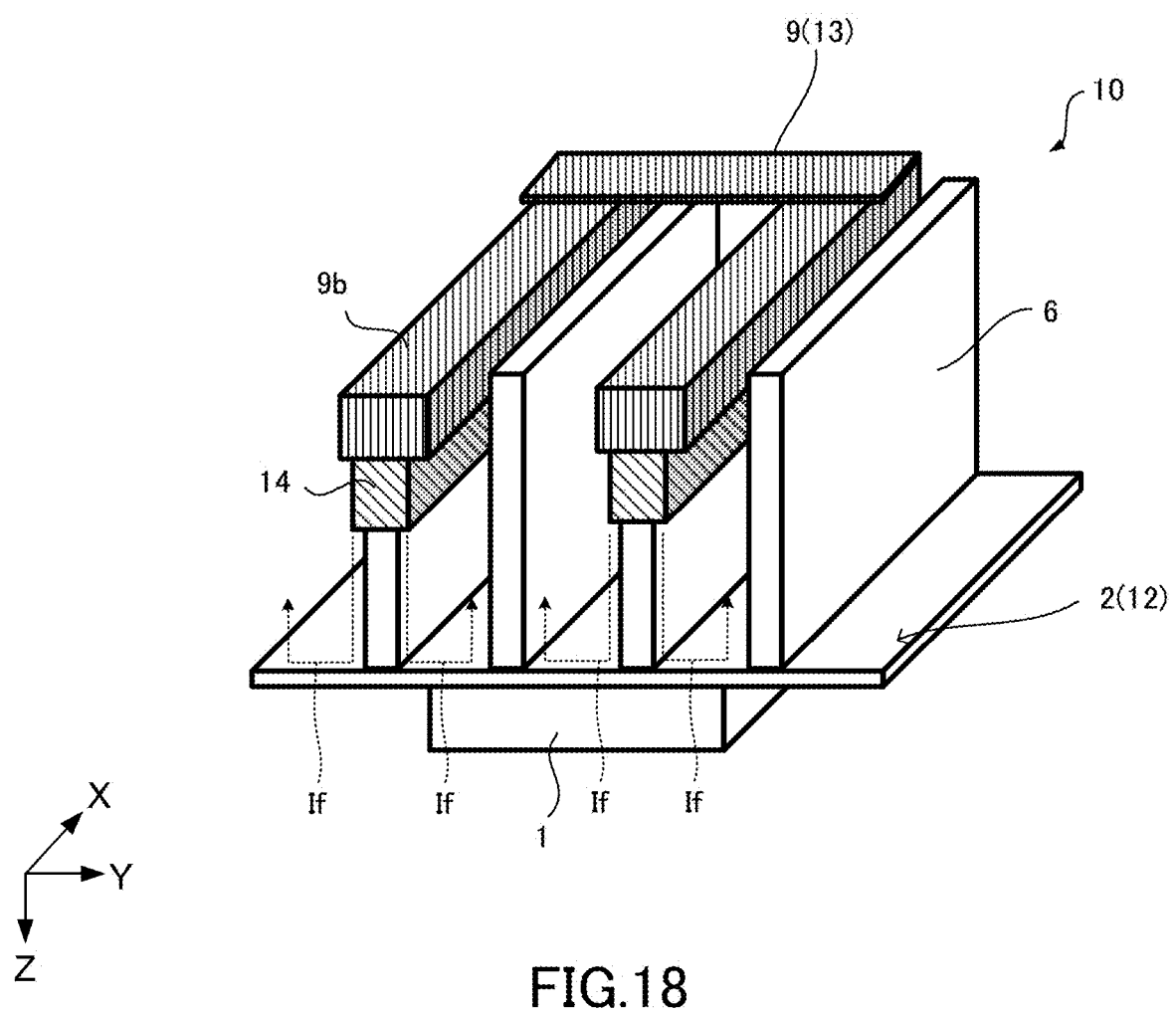
FIG. 18 is a main part perspective view for explaining the configuration of a cooling apparatus according to a modification 4-2.

FIG. 18 is a main part perspective view of a cooling apparatus 10 according to the modification 4-2. As illustrated, in the cooling apparatus 10 according to this modification, compared to the configuration of the cooling apparatus 10 described in FIG. 17, only the first and third projections 9b of a support member 9 from the left side in the figure are configured as a second electrode 13. With this configuration, it is possible to flow induced flows If to swirl between adjacent heat dissipation fins 6.

(Modification 4-3)

Figure 19:
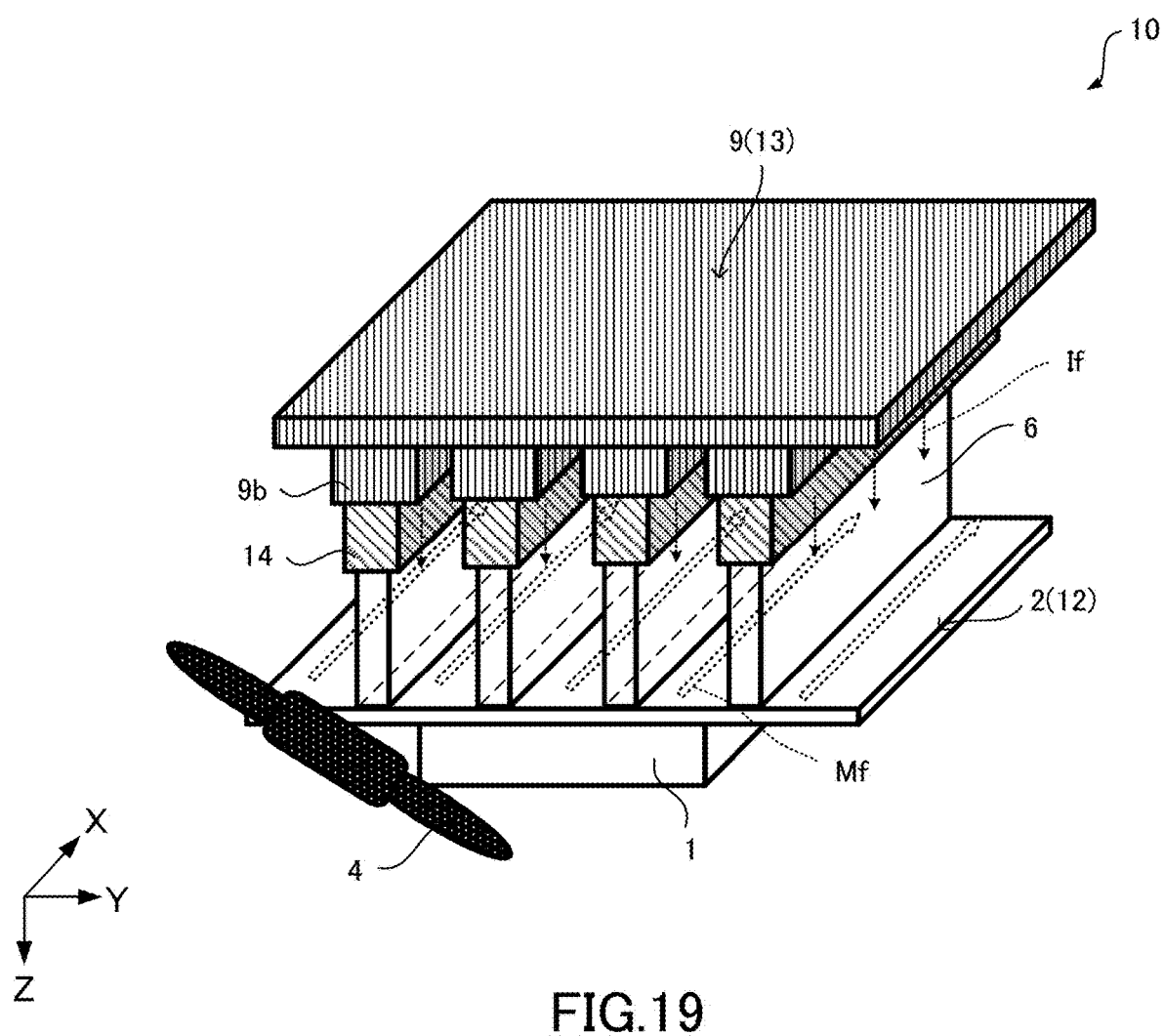
FIG. 19 is a main part perspective view for explaining the configuration of a cooling apparatus according to a modification 4-3.

FIG. 19 is a main part perspective view of a cooling apparatus 10 according to the modification 4-3. As illustrated, in the cooling apparatus 10 according to this modification, in addition to the configuration of the cooling apparatus 10 described in FIG. 16, a fan 4 is further provided which generates a main flow Mf that flows in the X-axis positive direction in spaces between adjacent heat dissipation fins 6. With this configuration, it is possible to make the main flow Mf approach a heat sink body 2 by the action of induced flows If. The heat dissipation fins 6 may be formed in a protruding manner.

(Modification 4-4)

Figure 20:
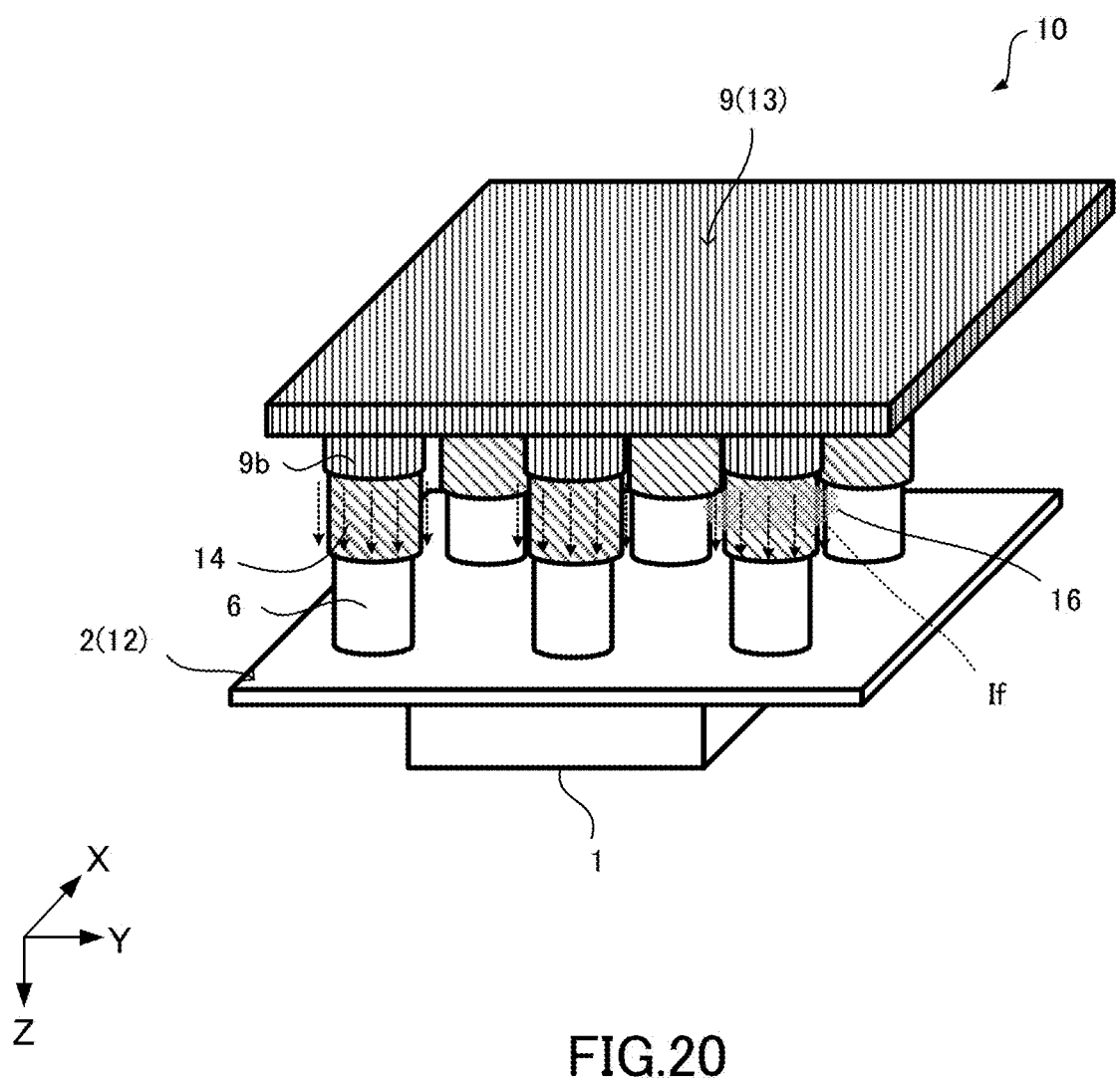
FIG. 20 is a main part perspective view for explaining the configuration of a cooling apparatus according to a modification 4-4.

FIG. 20 is a main part perspective view of a cooling apparatus 10 according to the modification 4-4. As illustrated, in the cooling apparatus 10 according to this modification, instead of the shape of the heat dissipation fins 6 of the cooling apparatus 10 described in FIG. 16, protruding heat dissipation fins 6 having a generally cylindrical shape are configured. Further, the shape of projections 9b of a support member 9 and the shape of dielectrics 14 are also formed to be generally cylindrical. The diameters of the generally cylindrical shapes of these respective members are set to be larger in ascending order of the heat dissipation fins 6, the dielectrics 14, and the projections 9b. With this configuration, it is possible to generate induced flows If that flow downward in the figure (the Z-axis positive direction) along the peripheral regions of the projections 9b of the support member 9.

(Modification 4-5)

Figure 21:
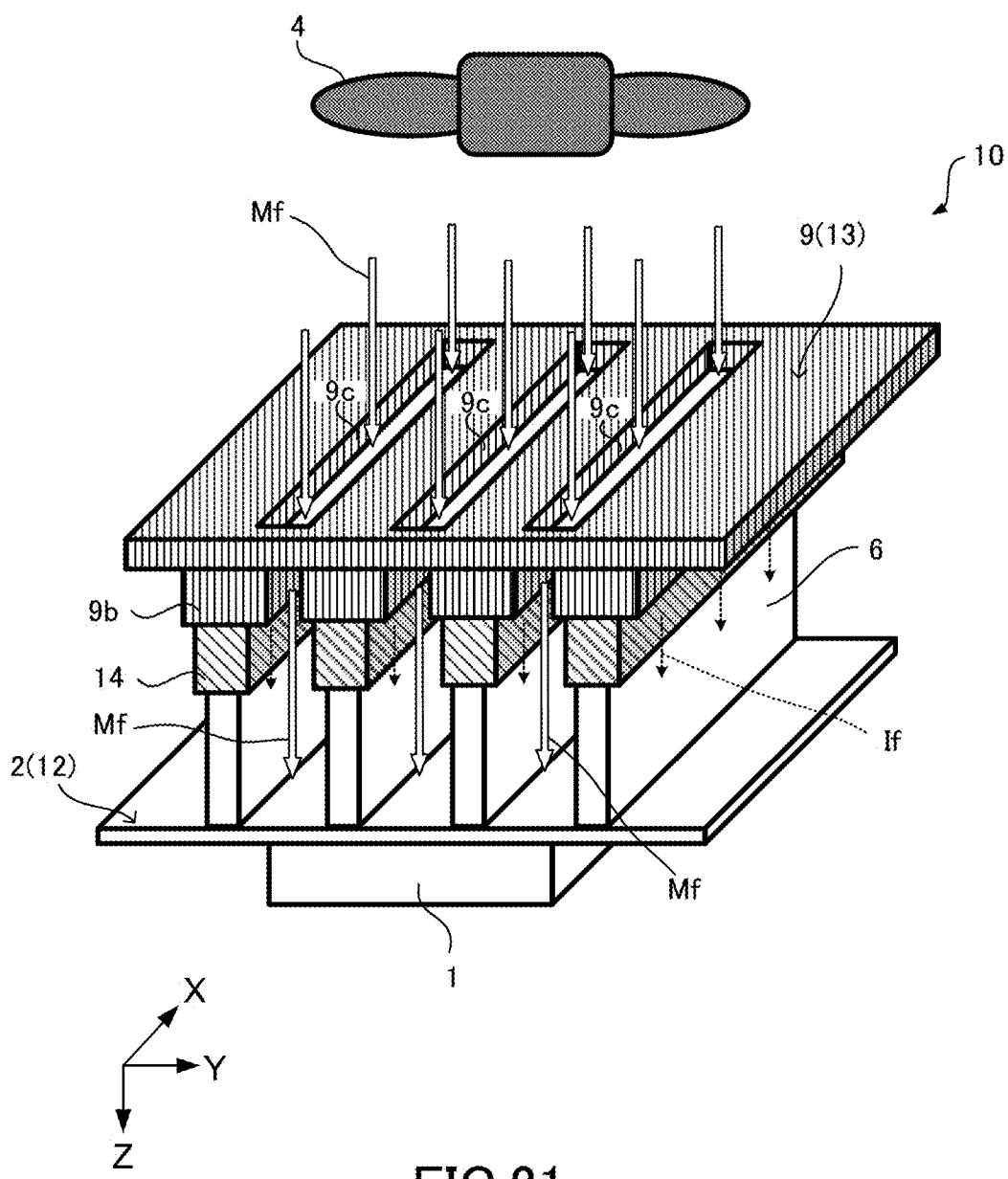
FIG. 21 is a main part perspective view for explaining the configuration of a cooling apparatus according to a modification 4-5.

FIG. 21 is a main part perspective view of a cooling apparatus 10 according to the modification 4-5. As illustrated, in the cooling apparatus 10 according to this modification, compared to the configuration of the cooling apparatus 10 described in FIG. 16, a plurality of (three in FIG. 21) slit portions 9c is formed in a support member 9.

The slit portions 9c are respectively provided at positions in the support member 9 facing spaces between adjacent heat dissipation fins 6 and extend along the X-axis direction in the surface of the support member 9. Further, a fan 4 is disposed on the Z-axis negative direction side of the slit portions 9c so as to face the slit portions 9c. With this configuration, a main flow Mf from the fan 4 passes through the slit portions 9c and flows toward a heat sink body 2 in the spaces between the adjacent heat dissipation fins 6. Further, since induced flows If flow in the Z-axis positive direction from projections 9b, it is possible to accelerate the main flow Mf by the induced flows If to increase the flow velocity of the main flow Mf.

(Modification 4-6)

Figure 22:
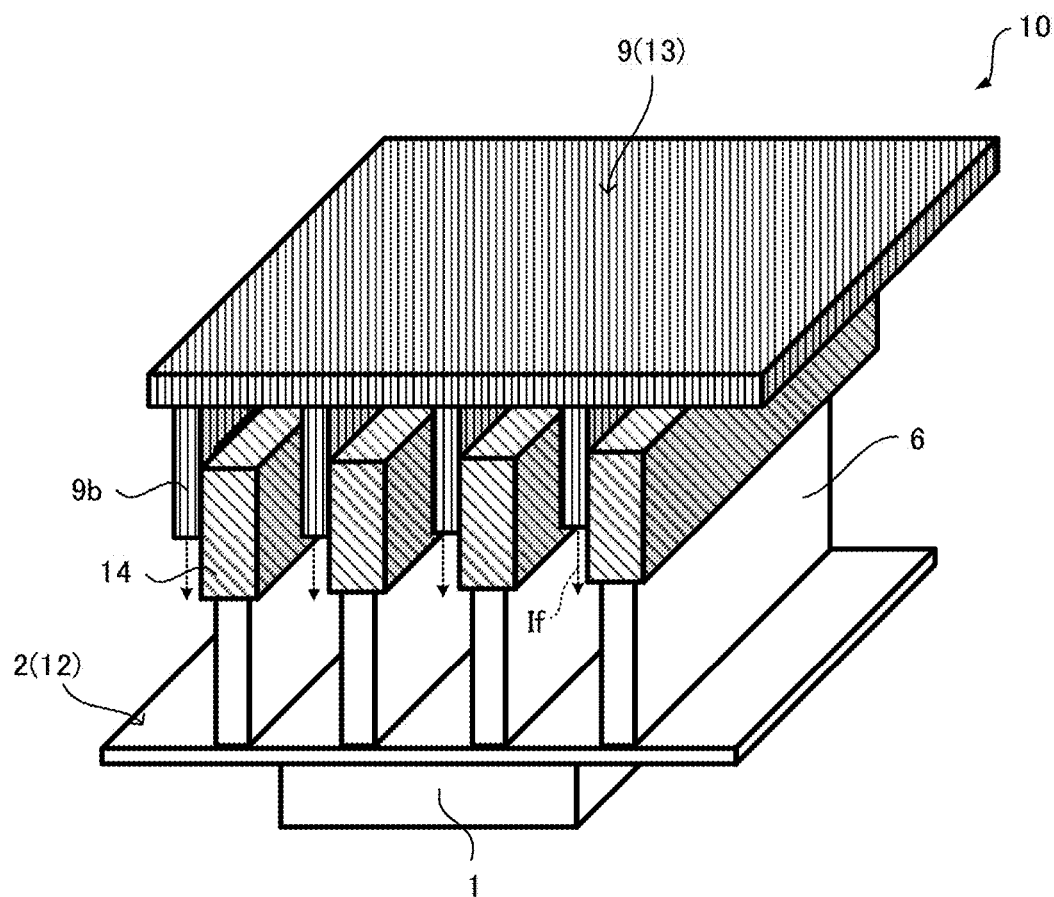
FIG. 22 is a main part perspective view for explaining the configuration of a cooling apparatus according to a modification 4-6.
Figure 22:
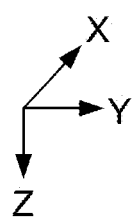

FIG. 22 is a main part perspective view of a cooling apparatus 10 according to the modification 4-6. As illustrated, the cooling apparatus 10 according to this modification uses as a basis the configuration of the cooling apparatus 10 described in FIG. 16 and is configured such that dielectrics 14 are sandwiched between projections 9b of a support member 9. With this configuration, the structure of the cooling apparatus 10 can be made more stable.

(Modification 4-7)

Figure 24:
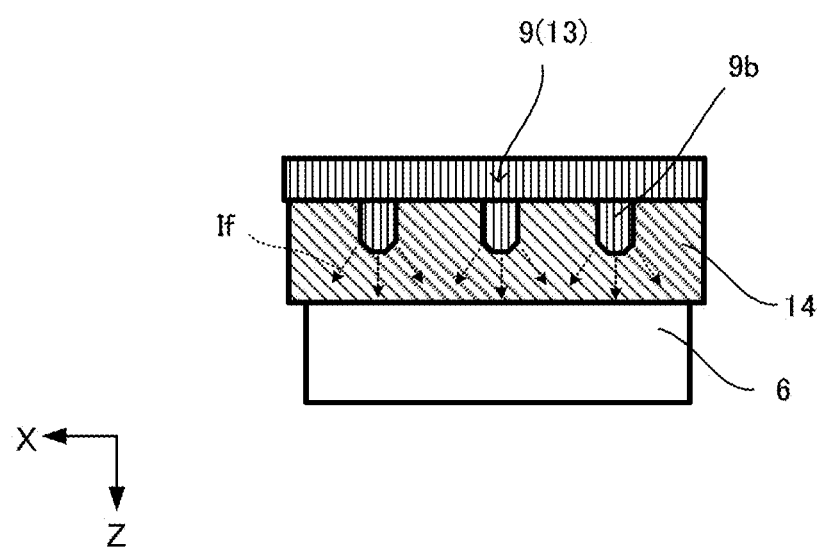
FIG. 24 is a diagram illustrating the configuration as viewed along the direction of an arrow AR in FIG. 23.

FIG. 23 is a main part perspective view of a cooling apparatus 10 according to the modification 4-7. FIG. 24 is a diagram illustrating the configuration as viewed along the direction of an arrow AR in FIG. 23. As illustrated, in the cooling apparatus 10 according to this modification, using as a basis the configuration of the cooling apparatus 10 described in FIG. 22, distal ends of projections 9b are formed to be tapered. With this configuration, it is possible to spread the direction of an induced flow If generated from each of the projections 9b so that the flows in spaces between heat dissipation fins 6 can be made turbulent.

Fifth Embodiment

A fifth embodiment will be described below. The same symbols are given to the same elements as those of the first embodiment to the fourth embodiment, and a description thereof is omitted. In this embodiment, a description will be given of another example of the cooling apparatus 10 employing as the induced flow generation device 3 the plasma actuator 17 described in FIG. 8. In particular, in this embodiment, a description will be given of the configuration of a cooling apparatus 10 in which a first electrode 12 of a plasma actuator 17 is configured in a heat sink (a heat sink body 2 and heat dissipation fins 6), and a second electrode 13 of the plasma actuator 17 is configured in a support member 9.

Figure 25:
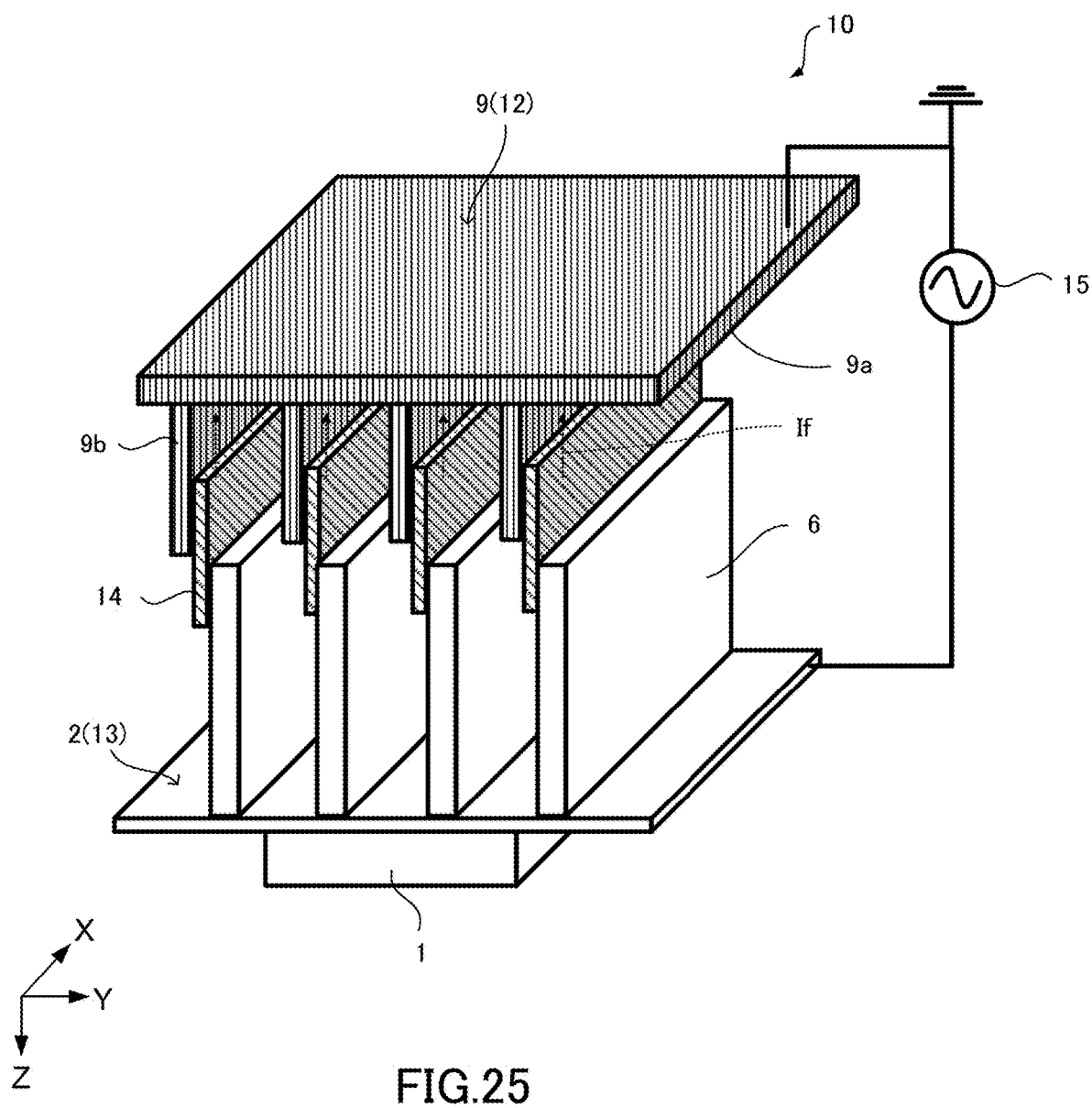
FIG. 25 is a main part perspective view for explaining the configuration of a cooling apparatus according to a fifth embodiment.

FIG. 25 is a main part perspective view for explaining the configuration of the cooling apparatus 10 according to this embodiment. As illustrated, in the cooling apparatus 10 according to this embodiment, the heat sink body 2 and the heat dissipation fins 6 are electrically connected to a power supply device 15 and function as the first electrode 12. On the other hand, the support member 9 is connected to a ground potential and functions as the second electrode 13. Consequently, the power supply device 15 applies an AC voltage between the heat sink body 2/the heat dissipation fins 6 and the support member 9 so that these operate as the plasma actuator 17.

Therefore, induced flows If heading in the direction of a surface 9a of the support member 9 from dielectrics 14 into an air layer 7 are generated by a voltage difference generated between the heat sink body 2/the heat dissipation fins 6 and the support member 9. As a result, with the configuration of the cooling apparatus 10 of this embodiment, it is possible to generate the induced flows If that control the flow of a main flow Mf, particularly the induced flows If that make the flow of the main flow Mf approach the surface 9a of the support member 9.

According to this embodiment having the configuration described above, the following operations and effects are exhibited.

In this embodiment, it is configured that the support member 9 is at the ground potential and that the potential of the heat sink (the heat sink body 2 and the heat dissipation fins 6) varies.

Consequently, it can be configured that the dielectrics 14 cover the entirety of surfaces (side surfaces of projections 9b) of the support member 9 that contact the heat sink. Therefore, it is possible to properly ensure the insulation between the heat sink body 2/the heat dissipation fins 6 and the support member 9. Further, with the configuration of this embodiment, since it is possible to generate the induced flows If heading in the direction of the surface 9a of the support member 9, when the influence of the heat generation of the plasma actuator 17 cannot be ignored, it is possible to make the main flow Mf get away from the heat sink body 2 so that the thermal interference to a heat generating body 1 can be suppressed.

Modifications 5-1 to 5-3 of the fifth embodiment will be described below. The following modifications 5-1 to 5-3 each exemplify a specific configuration that can be selected as appropriate by taking into account the flow directions of a main flow Mf and an induced flow If, the cooling performance, the insulation performance, the output performance of a fan 4, and the pressure loss that are required.

(Modification 5-1)

Figure 26:
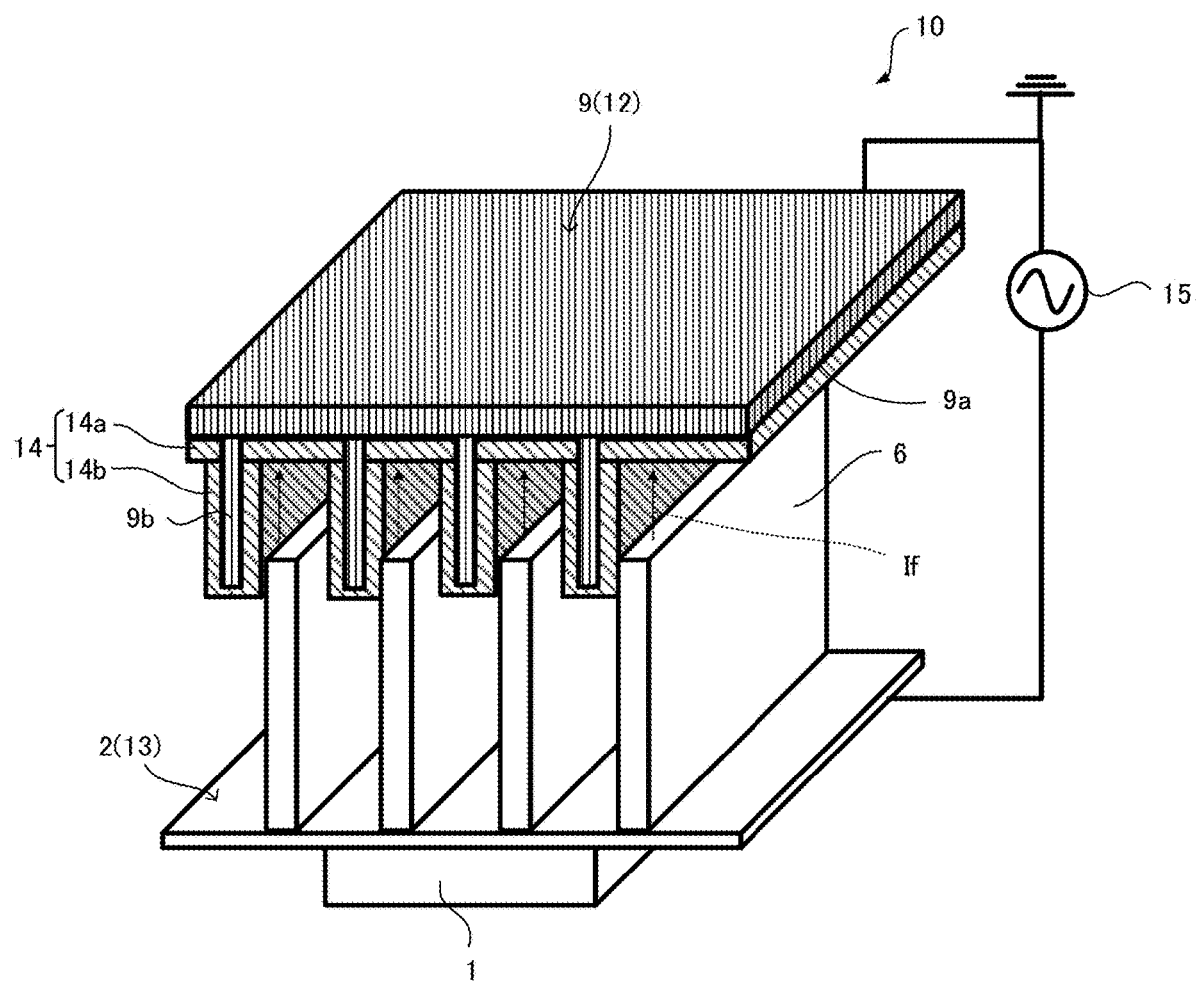
FIG. 26 is a main part perspective view for explaining the configuration of a cooling apparatus according to a modification 5-1.

FIG. 26 is a main part perspective view of a cooling apparatus 10 according to the modification 5-1. The cooling apparatus 10 according to this modification uses as a basis the configuration of the cooling apparatus 10 described in FIG. 25 and differs in the configuration of dielectrics 14. Specifically, the dielectrics 14 include plate-like base portions 14a covering the entirety of a surface 9a of a support member 9, and protruding portions 14b covering both side surfaces of projections 9b of the support member 9. Even with this configuration, it is possible to generate induced flows If that make the flow of a main flow Mf approach the surface 9a of the support member 9.

(Modification 5-2)

Figure 27:
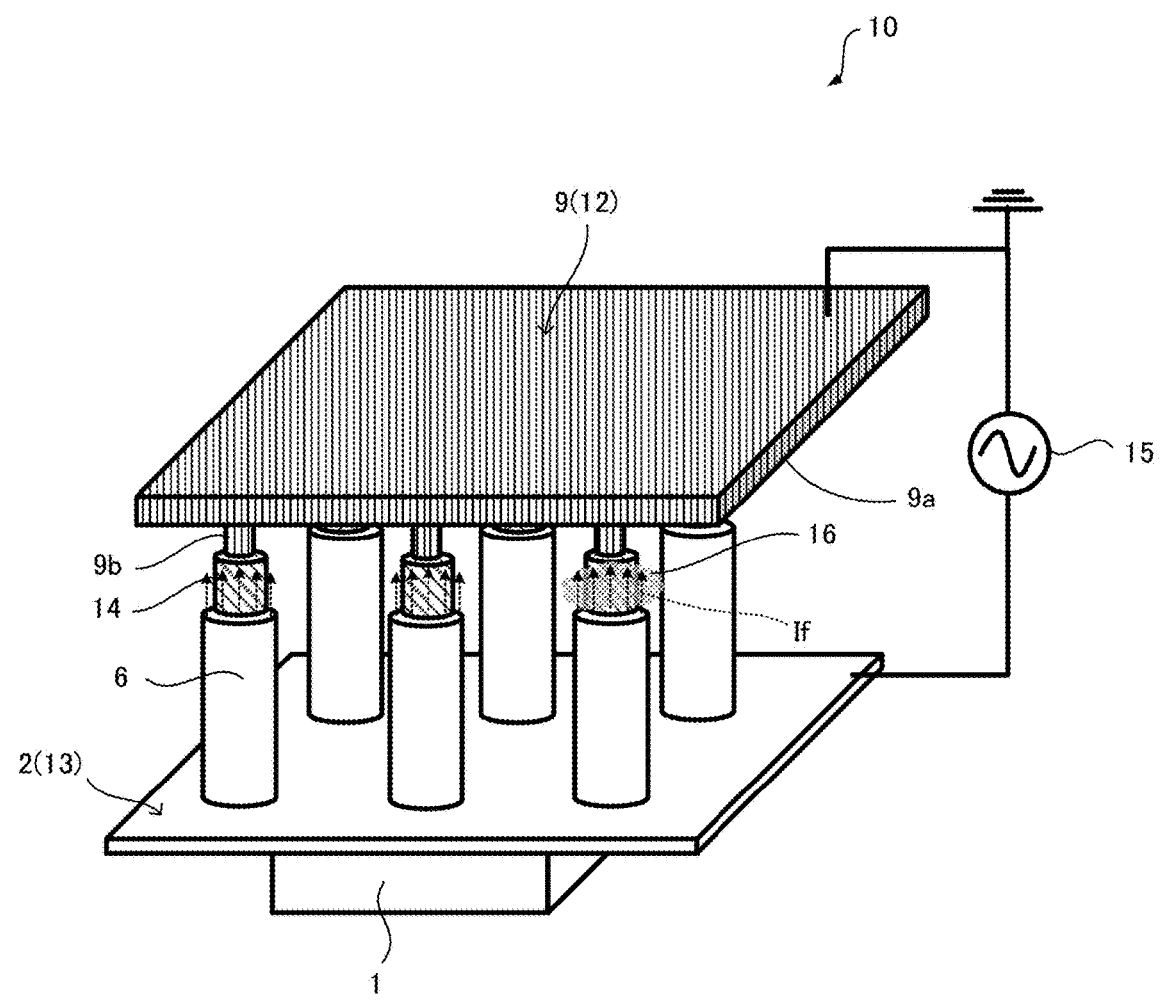
FIG. 27 is a main part perspective view for explaining the configuration of a cooling apparatus according to a modification 5-2.

FIG. 27 is a main part perspective view of a cooling apparatus 10 according to the modification 5-2. As illustrated, in the cooling apparatus 10 according to this modification, instead of the shape of the heat dissipation fins 6 of the cooling apparatus 10 described in FIG. 25, protruding heat dissipation fins 6 having a generally cylindrical shape are configured.

Further, the shape of projections 9b of a support member 9 and the shape of dielectrics 14 are also formed to be generally cylindrical. The diameters of the generally cylindrical shapes of these respective members are set to be larger in descending order of the heat dissipation fins 6, the dielectrics 14, and the projections 9b. With this configuration, it is possible to generate induced flows If that flow upward in the figure (the Z-axis negative direction) along the peripheral regions of the projections 9b of the support member 9.

(Modification 5-3)

Figure 28:
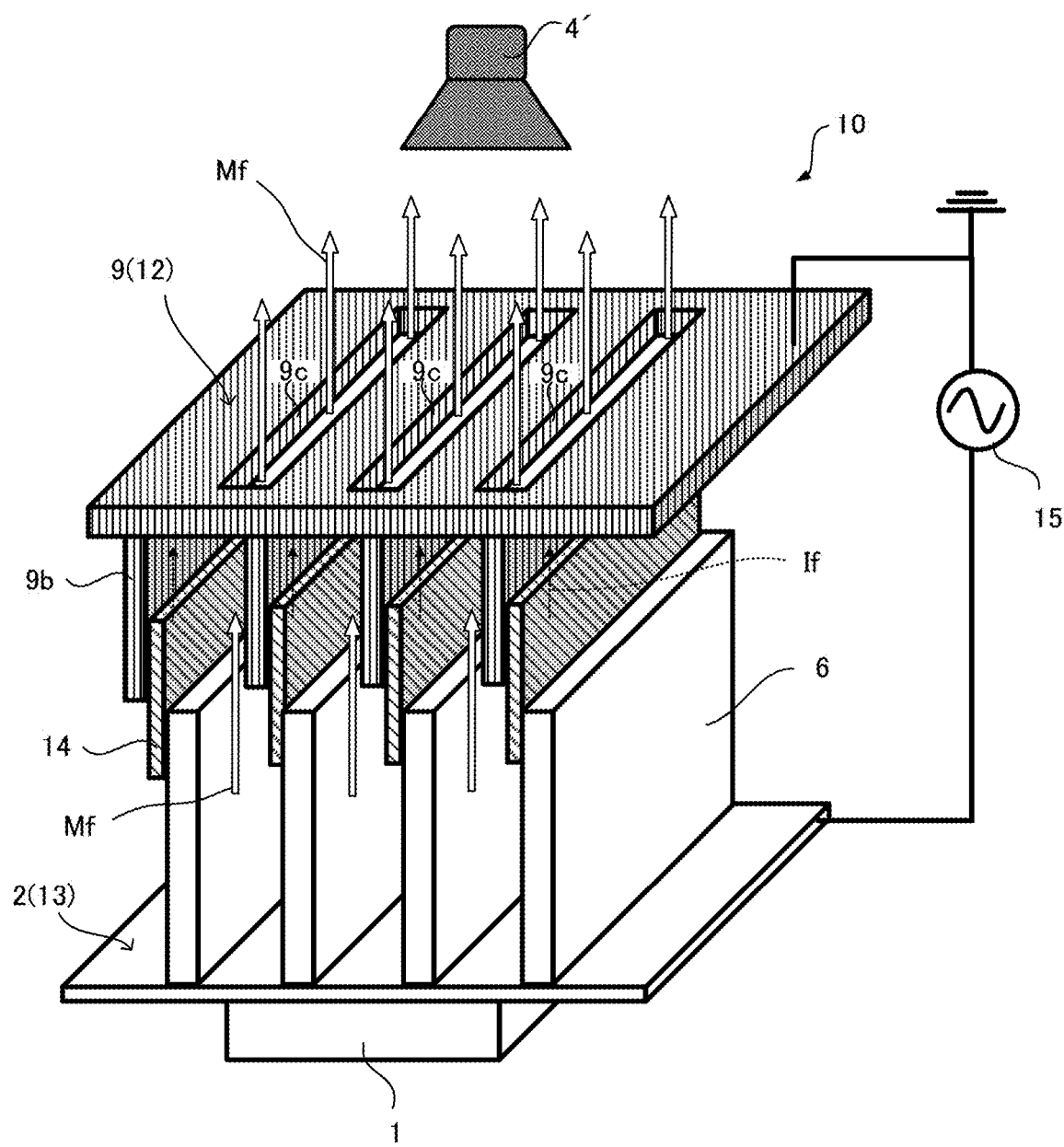
FIG. 28 is a main part perspective view for explaining the configuration of a cooling apparatus according to a modification 5-3.

FIG. 28 is a main part perspective view of a cooling apparatus 10 according to the modification 5-3. As illustrated, in the cooling apparatus 10 according to this modification, compared to the configuration of the cooling apparatus 10 described in FIG. 25, a plurality of (three in FIG. 28) slit portions 9c is formed in a support member 9.

The slit portions 9c are respectively provided at positions in the support member 9 facing spaces between adjacent heat dissipation fins 6 and extend along the X-axis direction in the surface of the support member 9. In this modification, a suction-type fan 4' is disposed on the Z-axis negative direction side of the slit portions 9c so as to face the slit portions 9c. With this configuration, with the operation of the fan 4', a main flow Mf is generated that flows in the spaces between the adjacent heat dissipation fins 6 in the direction from a heat sink body 2 to pass through the slit portions 9c (the Z-axis negative direction). Further, since induced flows If flow in the Z-axis negative direction from projections 9b, it is possible to accelerate the main flow Mf by the induced flows If to increase the flow velocity of the main flow Mf.

Instead of the arrangement of the suction-type fan 4' described in this embodiment, the fan 4' may be disposed perpendicular to induced flows If to adjust the direction of a main flow Mf.

While the embodiments of the present invention have been described above, the above-described embodiments and modifications only show part of application examples of the present invention and are not intended to limit the technical scope of the present invention to the specific configurations of the above-described embodiments.

For example, for the cooling apparatus 10 described in FIGS. 16 and 17 (the cooling apparatus 10 of the modifications 3-1 and 3-2), the description has been given of the example in which the fan 4 is disposed in the inlet 5a of the case 5. However, instead of this configuration, it may be configured that the fan 4 is disposed in the outlet 5b of the case 5 to suck the air through the outlet 5b by the operation of the fan 4.

The heat generating body 1 is illustrated to be generally square in the drawings describing the above-described embodiments. However, an electronic component such as a coil or a capacitor assumed as the heat generating body 1, or a heat generating body 1 having a shape according to that of another device or the like that requires cooling can also be applied to the above-described embodiments.

Further, in the above-described embodiments, the description has been given of the example in which one induced flow generation device 3 is provided for one heat generating body 1. However, not limited thereto, i.e. it may be configured that a plurality of induced flow generation devices 3 is provided for one heat generating body 1, or that one induced flow generation device 3 is provided for a plurality of heat generating bodies 1.

Further, a device other than the plasma actuator 17 described in the fourth embodiment can be used as the induced flow generation device 3. For example, the induced flow generation device 3 may be configured by another device that generates an air flow by the electrical action of a piezoelectric element or the like.

Further, in the above-described embodiments, the description has been given of the manner in which the induced flow If is generated in the direction generally perpendicular to or the direction generally parallel to the main flow Mf. However, the direction of the induced flow If to be generated is not limited to this manner, i.e. the induced flow If may be generated to form a predetermined angle to the main flow Mf. In particular, in terms of adjusting the flow direction of the main flow Mf or obtaining an action to assist the flow rate or the flow velocity of the main flow Mf, the direction of generating the induced flow If and the flow rate or the flow velocity of the induced flow If can be adjusted as appropriate.

In the above-described embodiments, the description has been given of the example in which the blower-type fan 4 or the suction-type fan 4' is used as the main flow generation device. However, as the main flow generation device, a device of another type may be employed as long as it fulfills the function to facilitate heat dissipation from the heat sink to the air layer 7. For example, instead of the fan 4 or the fan 4', a device may be employed that generates the flow of air flow near the heat sink by natural convection.

In the above-described embodiments, the description has been given of the manner in which the heat generating body 1 is directly joined to the first surface 2a of the heat sink body 2. However, instead of this configuration, in terms of more properly spreading the heat from the heat generating body 1 in the heat sink body 2, a heat spreader being a member that facilitates the spreading of the heat may be disposed between the heat generating body 1 and the heat sink body 2.

Such a heat spreader can be formed of a material the same as or different from that of the heat sink body 2 or the heat dissipation fins 6. In particular, the heat spreader is preferably formed of a material with a relatively high thermal conductivity, such as copper, aluminum, or a carbon structure (carbon black, diamond, or the like). More preferably, the heat spreader is made of a relatively low cost material such as copper.

In this way, by disposing the heat spreader between the heat generating body 1 and the heat sink body 2, the heat can be transferred more evenly without biasing to a specific portion of the heat sink body 2 or the heat dissipation fins 6. As a result, it is possible to increase a substantial heat transfer region between the heat sink body 2 or the heat dissipation fins 6 and the main flow Mf/the induced flow If so that the heat transfer performance can be further improved.

The invention claimed is:

1. A cooling apparatus comprising:
    a heat sink having a first surface to which a heat generating body is joined and a second surface opposite the first surface;
    a support member having a surface facing the second surface of the heat sink such that the second surface of the heat sink is separated from the surface of the support member by a space;
    a main flow generation device configured to generate a main flow through the space between the second surface of the heat sink and the surface of the support member; and
    an induced flow generation device comprising:
        electrodes to which a predetermined voltage is applied, and
        an induced flow generation part configured to electrically generate an induced flow flowing in a predetermined direction by the voltage applied to the electrodes, the induced flow generation device being located at the surface of the support member facing the second surface of the heat sink,
        wherein the induced flow generation device is disposed at a position so that the induced flow is generated to adjust the main flow to a desired state.

2. The cooling apparatus according to claim 1, wherein:
    the induced flow generation device includes a plasma actuator having a first electrode and a second electrode serving as the electrodes and a dielectric disposed between the first electrode and the second electrode; and
    the cooling apparatus further includes a control device configured to control a magnitude and a frequency of an AC voltage applied to the plasma actuator according to a desired flow of the main flow.

3. The cooling apparatus according to claim 1, wherein the induced flow generation device is disposed so as to generate the induced flow in a direction to guide the flow of the main flow to the heat sink.

4. The cooling apparatus according to claim 3, wherein the induced flow generation device and the main flow generation device are disposed so that the main flow and the induced flow are generally parallel to each other and generally opposite to each other.

5. The cooling apparatus according to claim 3, wherein the induced flow generation device is disposed so that the induced flow is generally perpendicular to a direction from the support member toward the heat sink.

6. The cooling apparatus according to claim 3, comprising at least two induced flow generation devices.

7. The cooling apparatus according to claim 3, wherein the induced flow generation device is disposed at an upstream position of the heat generating body in a flow direction of the main flow.

8. The cooling apparatus according to claim 1, wherein the induced flow generation device is disposed so as to generate the induced flow in a direction to guide the main flow to the support member.

9. The cooling apparatus according to claim 8, wherein the induced flow generation device is disposed so as to generate the induced flow generally parallel to and generally in the same direction as the main flow.

10. The cooling apparatus according to claim 8, wherein the induced flow generation device is disposed at a downstream position of the heat generating body in a flow direction of the main flow.

11. The cooling apparatus according to claim 1, wherein the induced flow generation device and the main flow generation device are disposed so that the main flow and the induced flow are generally perpendicular to each other and that the induced flow is generally parallel to a surface of the heat sink.

12. The cooling apparatus according to claim 1, wherein the heat sink further includes a heat dissipation fin provided to the second surface of the heat sink.

13. The cooling apparatus according to claim 12, wherein the heat dissipation fin is provided in plurality in a comb teeth shape.

14. The cooling apparatus according to claim 13, wherein the heat dissipation fins are formed in a protruding manner.

15. The cooling apparatus according to claim 1, wherein the support member is configured as a part of a case housing the heat sink.

16. The cooling apparatus according to claim 1, wherein the heat generating body is an electronic component provided in an electronic device.

17. The cooling apparatus according to claim 1, wherein:
    the induced flow generation device includes a plasma actuator configured such that a dielectric is disposed between a first electrode and a second electrode, the induced flow generation device is provided to the support member; and
    the first electrode is configured in the heat sink, and the second electrode is configured in the support member.

18. The cooling apparatus according to claim 17, wherein the cooling apparatus is configured such that the heat sink is at a ground potential and that a potential of the support member varies.

19. The cooling apparatus according to claim 17, wherein the cooling apparatus is configured such that the support member is at a ground potential and that a potential of the heat sink varies.

* * * * *